(12) United States Patent
Lin et al.

(10) Patent No.: US 12,424,520 B2
(45) Date of Patent: Sep. 23, 2025

(54) SEMICONDUCTOR DEVICE WITH BACK-SIDE VIA STRUCTURE

(71) Applicant: TAIWAN SEMICONDUCTOR MANUFACTURING COMPANY, LTD., Hsinchu (TW)

(72) Inventors: Ta-Chun Lin, Hsinchu (TW); Jhon-Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 369 days.

(21) Appl. No.: 18/173,627

(22) Filed: Feb. 23, 2023

(65) Prior Publication Data
US 2024/0203829 A1 Jun. 20, 2024

Related U.S. Application Data

(60) Provisional application No. 63/433,219, filed on Dec. 16, 2022.

(51) Int. Cl.
*H01L 23/48* (2006.01)
*H10D 30/67* (2025.01)
*H10D 64/01* (2025.01)

(52) U.S. Cl.
CPC ....... *H01L 23/481* (2013.01); *H10D 30/6735* (2025.01); *H10D 30/6757* (2025.01); *H10D 64/021* (2025.01)

(58) Field of Classification Search
CPC ............. H01L 29/786; H01L 21/76898; H01L 23/481; H10D 30/501–509; H10D 30/60–6759
See application file for complete search history.

(56) References Cited

U.S. PATENT DOCUMENTS

| | | | |
|---|---|---|---|
| 2021/0399099 A1* | 12/2021 | Chu | H01L 21/76831 |
| 2022/0028786 A1* | 1/2022 | Huang | H10D 62/121 |
| 2022/0093766 A1* | 3/2022 | Chen | H10D 62/121 |
| 2022/0139911 A1* | 5/2022 | Wei | H01L 23/5226 257/365 |

\* cited by examiner

*Primary Examiner* — Lauren R Bell
(74) *Attorney, Agent, or Firm* — Cooper Legal Group, LLC

(57) ABSTRACT

A semiconductor device includes a transistor structure disposed on a first side of a substrate and a back-side via structure disposed on a second side of the substrate opposite to the first side. The transistor structure includes a pair of epitaxial structures and a channel feature extending in a channel length direction to be disposed between the epitaxial structures. The channel feature has a width in a channel width direction transverse to the channel length direction. The back-side via structure extends through the substrate so as to be connected to a bottom surface and a sidewall surface of a lower portion of a corresponding one of the epitaxial structures. The back-side via structure has a width in the channel width direction, which is greater than the width of the channel feature.

20 Claims, 32 Drawing Sheets

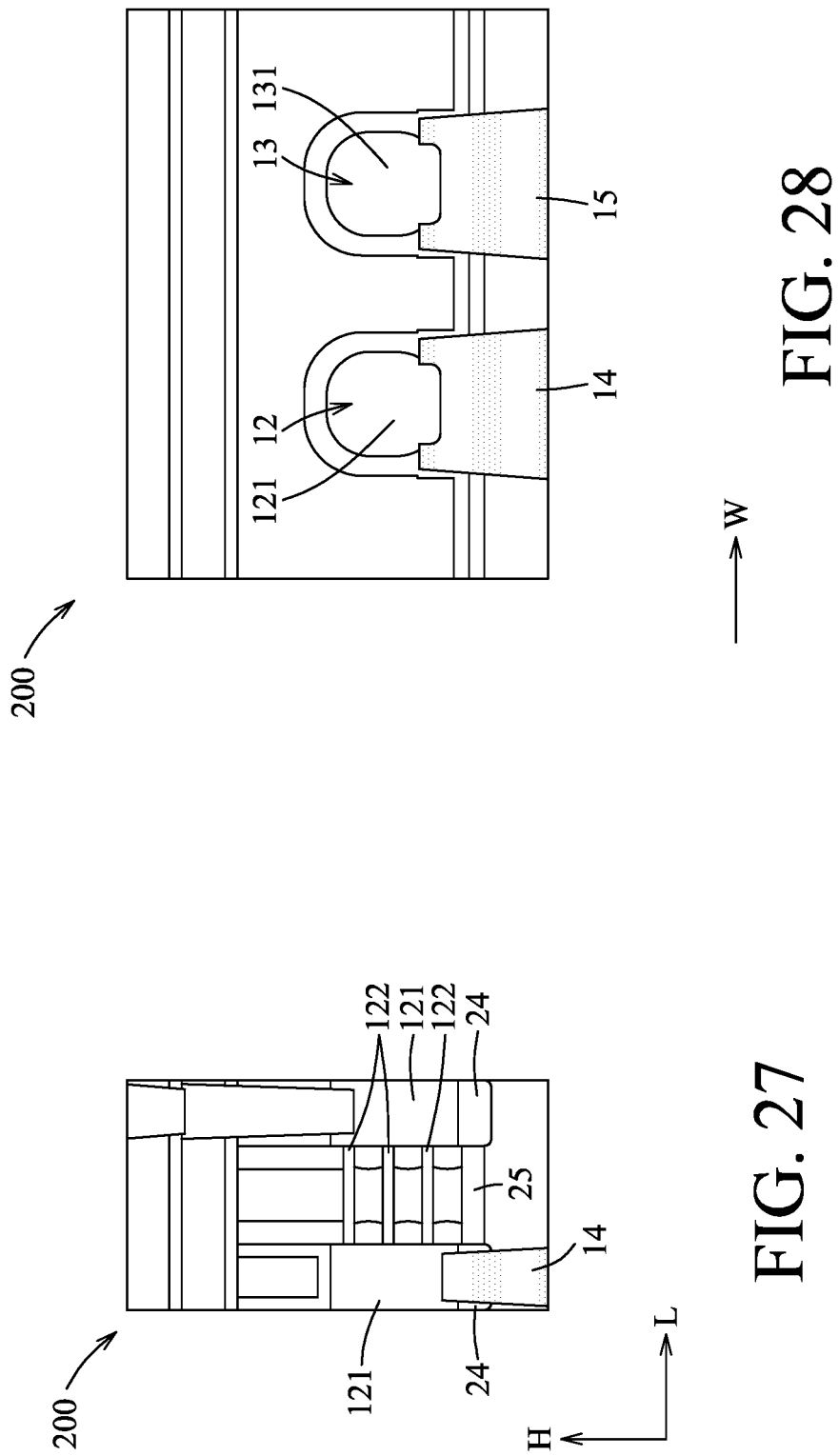

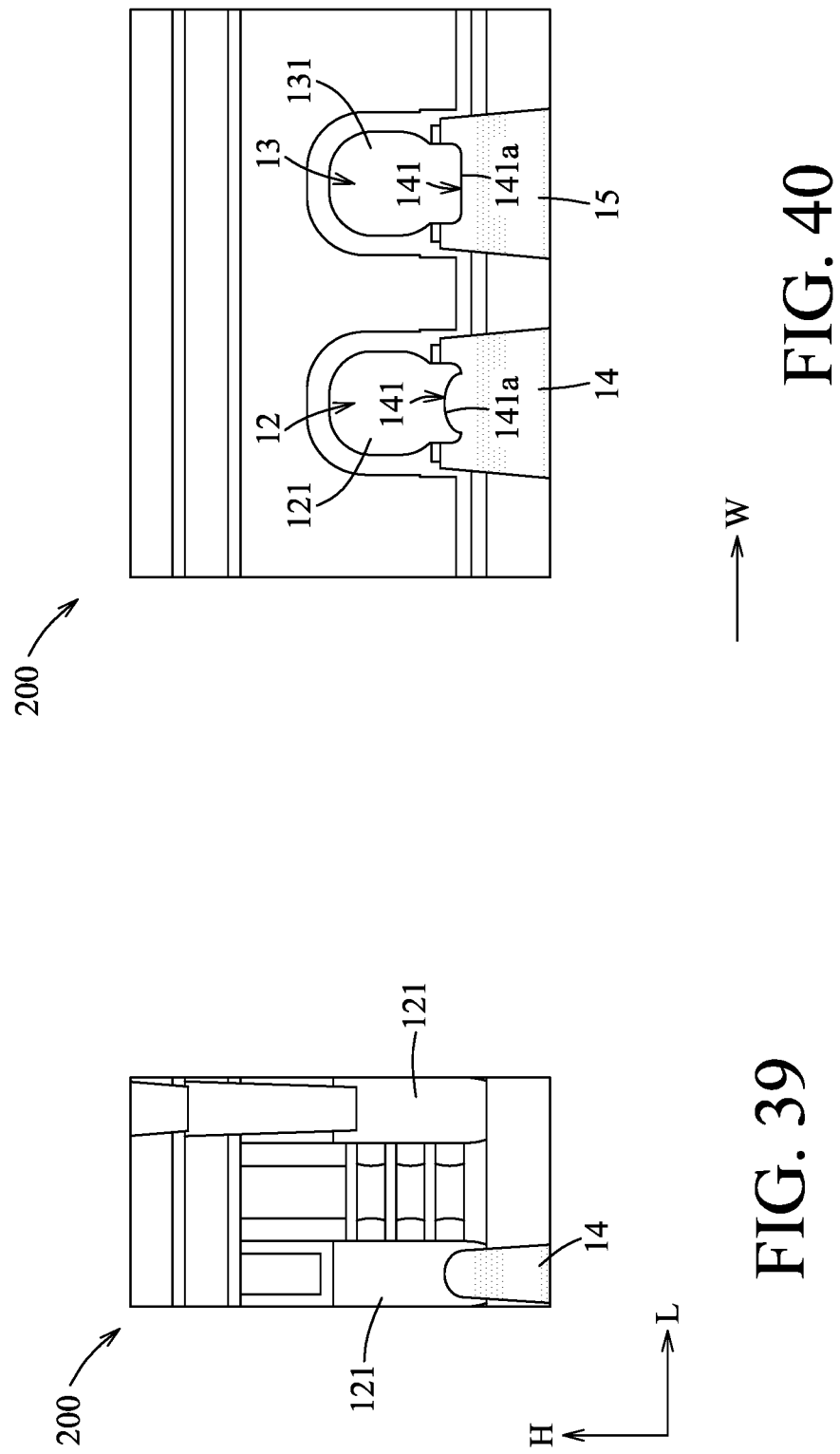

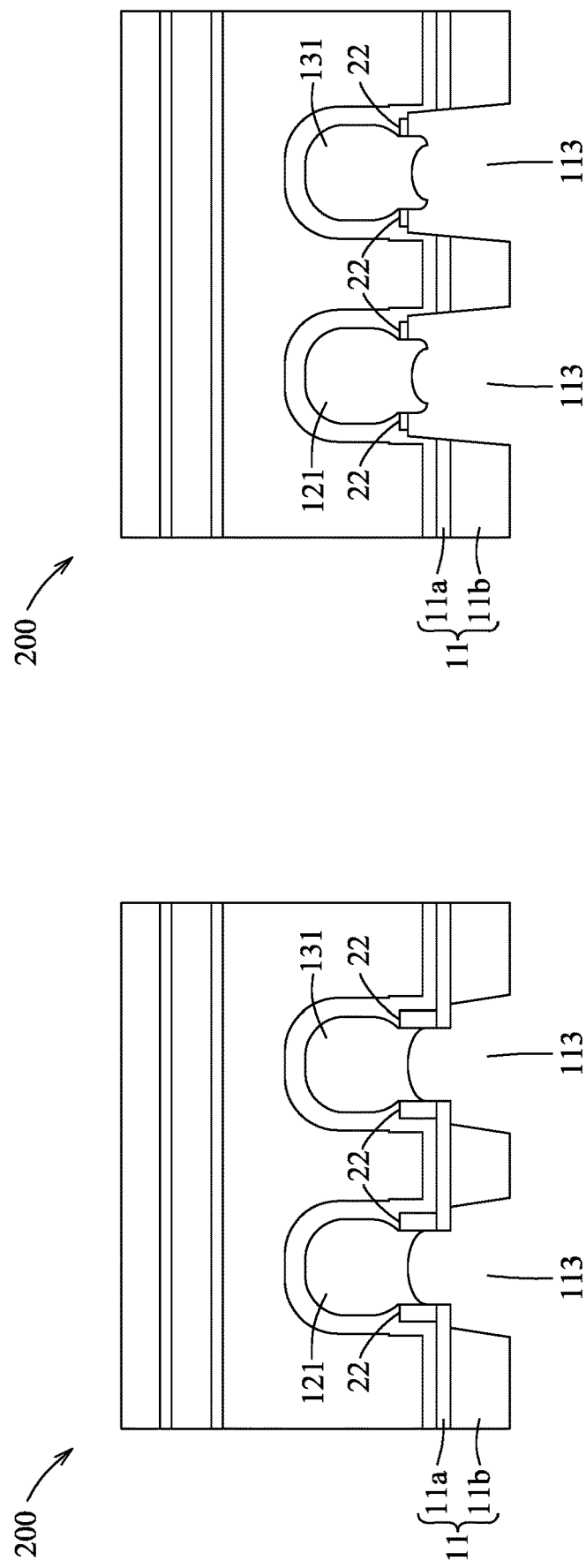

SEMICONDUCTOR DEVICE WITH BACK-SIDE VIA STRUCTURE

REFERENCE TO RELATED APPLICATION

This application claims priority of U.S. Provisional Application No. 63/433,219 filed on Dec. 16, 2022, the contents of which is incorporated herein by reference in its entirety.

BACKGROUND

In a method for manufacturing a semiconductor device, formation of a back-side power rail with a back-side via is a novel semiconductor technique developed for electrical connection of the power rail to a semiconductor structure (for example, a transistor) that is disposed on a front side of a substrate of the semiconductor device. For example, the back-side via can be in contact with a source/drain region of the transistor formed on the front side of the substrate of the semiconductor device. However, the back-side via has a resistance higher than that of a contact via formed on the front side of the substrate for electrically connecting the source/drain region of the transistor due to a poor contact resistance between the back-side via and the source/drain region of the transistor, which is caused by ineffective activation of implanted dopant in the source/drain region due to a limited thermal budget.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 27 to 29 are schematic views of a semiconductor device manufactured according to the layout depicted in FIG. 1 and taken along reference lines A-A, B-B, C-C of FIG. 1, respectively, in accordance with some embodiments.

FIGS. 39 to 41 are schematic views of a semiconductor device manufactured according to the layout depicted in FIG. 1 and taken along reference lines A-A, B-B, C-C of FIG. 1, respectively, in accordance with some embodiments.

FIGS. 49 to 63 are schematic views illustrating some intermediate stages of the method as depicted in FIG. 48 in accordance with some embodiments.

DETAILED DESCRIPTION

Figure 2:
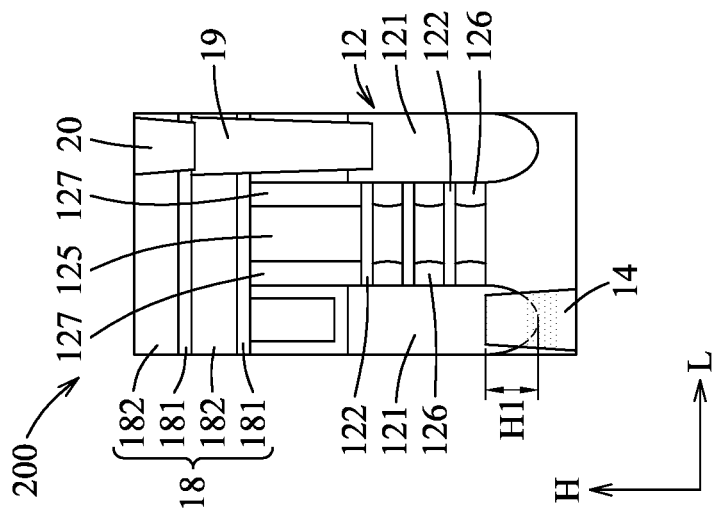
FIGS. 2 to 4 are schematic views of a semiconductor device manufactured according to the layout depicted in FIG. 1 and taken along reference lines A-A, B-B, C-C of FIG. 1, respectively, in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "upper," "lower," "back side," "front side," "below," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
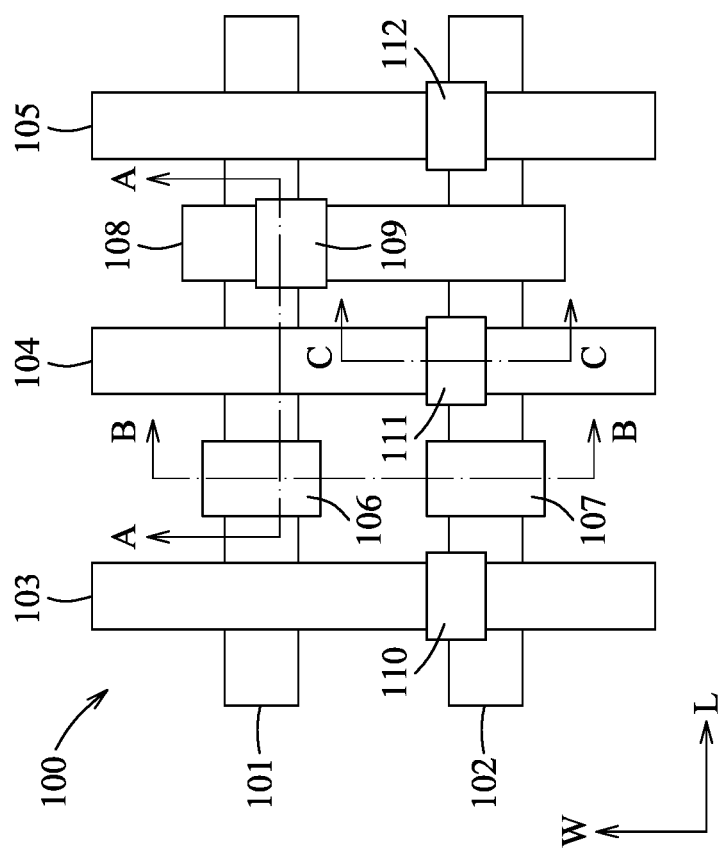
FIG. 1 is a schematic layout view of a standard cell in accordance with some embodiments.

FIG. 1 is a schematic layout view of a standard cell 100 in accordance with some embodiments. Not all layout patterns of the standard cell 100 are depicted in FIG. 1. In addition, a person having ordinary skill in the art would appreciate that the layout patterns may be used to prepare a plurality of masks, which in turn can be used for manufacturing the standard cell 100.

The layout of the standard cell 100 includes a first active region layout pattern 101; a second active region layout pattern 102; polysilicon layout patterns 103, 104, 105; metal layout patterns of a first type 106, 107; a metal layout pattern of a second type 108; a metal layout pattern of a third type 109; and metal layout patterns of a fourth type 110, 111, 112. The first and second active region layout patterns 101, 102 are associated with forming active region structures of the standard cell 100. The first and second active region layout patterns 101, 102 are sometimes referred to as oxide-definition (OD) regions. In some embodiments, the first active region layout pattern 101 defines one of a P-type transistor region and an N-type transistor region, and the second active region layout pattern 102 defines the other one of the P-type transistor region and the N-type transistor region. The polysilicon layout patterns 103, 104, 105 are associated with forming corresponding polysilicon structures of the standard cell 100. The polysilicon layout patterns 103, 104, 105 overlap the first and second active region layout patterns 101, 102. In some embodiments, the polysilicon layout patterns 103, 104, 105 are associated with forming gate structures of the standard cell 100. The metal layout patterns 106, 107 are associated with forming corresponding metal structures of a first type. In some embodiments, the metal structures of the first type are referred to as back-side via structures. The metal layout patterns 106, 107 overlap the first and second active region layout patterns 101, 102, respectively. The metal layout pattern 108 is associated with forming a corresponding metal structure of a second type. In some embodiments, the metal structure of the second type is referred to as a MD structure (a metal contact disposed on the active region structures). The metal layout pattern 108 overlaps the first and second active region layout patterns 101, 102. The metal layout pattern 109 is associated with forming a corresponding metal structure of a third type. In some embodiments, the metal structure of the third type is referred to as a VD structure (a metal contact disposed on the MD structure). The metal layout patterns 110, 111, 112 are associated with forming corresponding metal structures of a fourth type. In some embodiments, the metal structures of the fourth type are referred to as MG structures (metal contacts disposed on the gate structures, respectively). The metal layout patterns 110, 111, 112 are disposed to be spaced apart from each other in a channel length direction (L) of the first active region layout pattern 101 (or the second active region layout pattern 102). The metal layout patterns 106, 107 are disposed to be spaced apart from each other in a channel width direction (W) of the first active region layout pattern 101 (or the second active region layout pattern 102). The channel width direction (W) is transverse to the channel length direction (L). In some embodiments, the channel width direction (W) and the channel length direction (L) are perpendicular to each other. In the layout of the standard cell 100 in accordance with some embodiments, the metal layout patterns 106, 107 have critical dimensions greater than those of the first and second active region layout patterns 101, 102, respectively, in the channel width direction (W).

Figure 4:
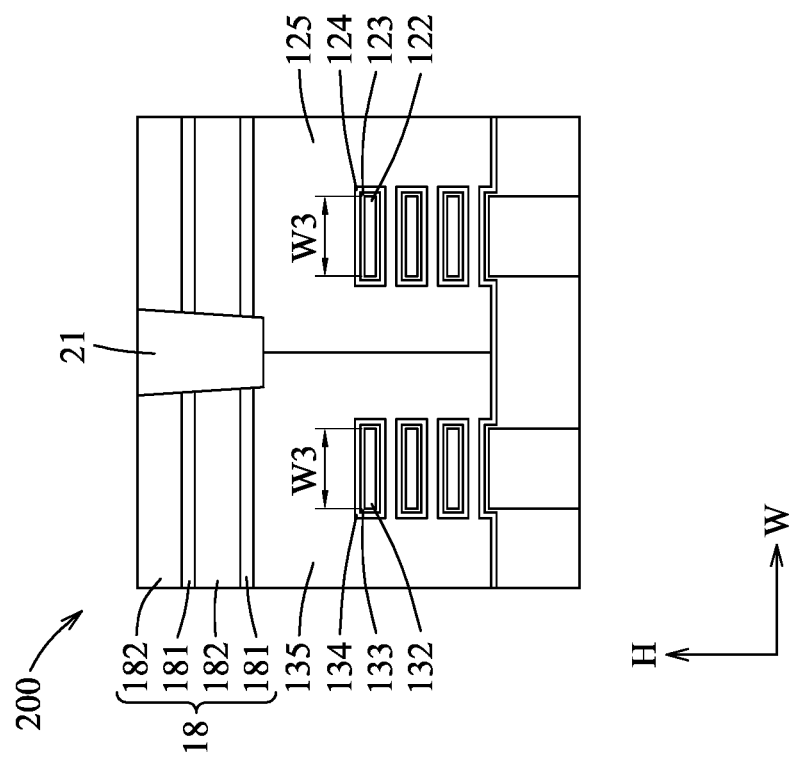
Figure 3:
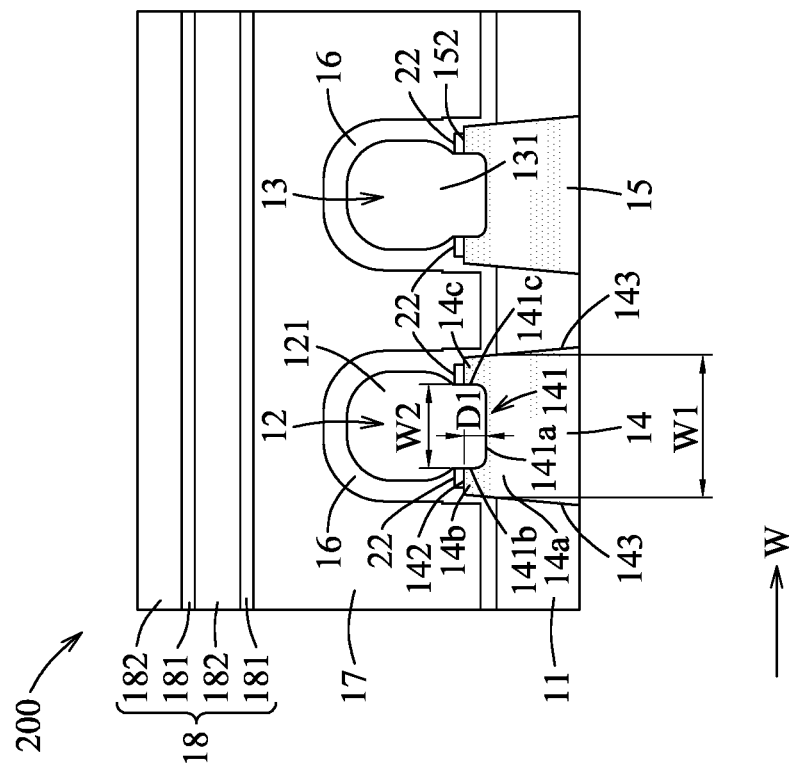

FIGS. 2 to 4 are schematic views of a semiconductor device 200 manufactured according to the layout depicted in FIG. 1 and taken along reference lines A-A, B-B, C-C of FIG. 1, respectively, in accordance with some embodiments. The semiconductor device 200 includes a substrate 11, a first transistor structure 12, a second transistor structure 13, a first back-side via structure 14, a second back-side via structure 15, a contact etch stop layer (CESL) 16, a dielectric layer 17, a multilayer etch stop structure 18, a first metal contact 19, a second metal contact 20, and a third metal contact 21.

In some embodiments, the substrate 11 may be a semiconductor substrate. In some embodiments, the semiconductor substrate may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the composition ratio thereof changes from one location to another location in the compound semiconductor.

The first transistor structure 12 and the second transistor structure 13 are formed on a first side of the substrate 11. In some embodiments, the first transistor structure 12 and the second transistor structure 13 are formed on a front side of the substrate 11, and are spaced apart from each other by a portion of the dielectric layer 17 in the channel width direction (W). In some embodiments, one of the first transistor structure 12 and the second transistor structure 13 is configured as a P-type transistor, and the other one of the first transistor structure 12 and the second transistor structure 13 is configured as a N-type transistor.

Referring to the examples illustrated in FIGS. 2 and 4, the first transistor structure 12 includes a first gate structure 125, a pair of first epitaxial structures 121 spaced part from each other by the first gate structure 125 in the channel length direction (L), a plurality of first channel features 122 which extend in the channel length direction (L) to be disposed between the first epitaxial structures 121 and which are spaced apart from each other in a channel height direction (H) transverse to the channel length direction (L) and the channel width direction (W), a plurality of first interfacial layers 123 respectively formed around the first channel features 122, a plurality of first gate dielectric layers 124 respectively formed around the first interfacial layers 123, a plurality of inner spacers 126 disposed to alternate with the first channel features 122 in the channel height direction (H) and to laterally cover a lower portion of the first gate structure 125 so as to separate the first epitaxial structures 121 from the lower portion of the first gate structure 125, and two gate spacers 127 formed at two opposite sides of an upper portion of the first gate structure 125 so as to laterally cover the upper portion of the first gate structure 125. In some embodiments, the channel height direction (H), the channel length direction (L), and the channel width direction (W) are perpendicular to one another. The lower portion of the first gate structure 125 is formed around the first gate dielectric layers 124.

The first gate structure 125 serves as a gate electrode of the first transistor structure 12. In some embodiments, the first gate structure 125 may include conductive metal (for example, but not limited to, aluminum (Al), copper (Cu), tungsten (W), cobalt (Co), ruthenium (Ru), titanium (Ti), tantalum (Ta), molybdenum (Mo), nickel (Ni), platinum (Pt), or combinations thereof), conductive metal nitride (for example, but not limited to, titanium nitride (TiN), tantalum nitride (TaN), or a combination thereof), conductive metal silicide (for example, but not limited to, nickel silicide (NiSi)), conductive metal carbide (for example, but not limited to, tantalum carbide (TaC)), or other suitable conductive materials.

The first epitaxial structures 121 serve as source/drain structures of the first transistor structure 12. In some embodiments in which the first transistor structure 12 serves as the P-type transistor, the first epitaxial structures 121 may include silicon (Si), silicon-germanium (SiGe), or other suitable semiconductor materials doped with a suitable P-type dopant (for example, but not limited to, boron (Br), aluminum (Al), gallium (Ga), or combinations thereof). Alternatively, in some embodiments in which the first transistor structure 12 serves as the N-type transistor, the first epitaxial structures 121 may include silicon (Si), silicon-germanium (SiGe), or other suitable semiconductor materials doped with a suitable N-type dopant (for example, but mot limited to, nitrogen (N), phosphorus (P), arsenic (As), or combinations thereof).

The first channel features 122 serve as channels of the first transistor structure 12. In some embodiments, the first channel features 122 may includes silicon (Si). In some embodiments, the first interfacial layers 123 may include a suitable low-k (low dielectric constant) material (for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), or silicon carbide (SiC)). In some embodiments, the first interfacial layers 123 may be made by thermal oxidation or other suitable techniques. In some embodiments, the first gate dielectric layers 124 may include a suitable high-k material (for example, but not limited to, hafnium oxide (for example, but not limited to, HfO$_2$), zirconium oxide (for example, but not limited to, ZrO$_2$), zirconium aluminum oxide (ZrAlOx), hafnium aluminum oxide (HfAlOx), hafnium silicon oxide (HfSiOx), aluminum oxide (for example, but not limited to, Al$_2$O$_3$), or combinations thereof).

In some embodiments, the inner spacers 126 may include a suitable low-k material selected from the examples described above or other suitable materials. In some embodiments, the gate spacers 127 may include a suitable low-k material selected from the examples described above or other suitable materials.

Referring the examples illustrated in FIGS. 3 and 4, the second transistor structure 13 includes a second gate structure 135, a plurality of second channel features 132 spaced apart from each other in the channel height direction (H), a plurality of second interfacial layers 133 respectively formed around the second channel features 132, and a plurality of second gate dielectric layers 134 respectively formed around the second interfacial layers 133. A lower portion of the second gate structure 135 is formed around the second gate dielectric layers 134. In some embodiments, the second gate structure 135 may include conductive metal, conductive metal nitride, conducive metal silicide, conductive metal carbide, or other suitable conductive materials selected from the examples described above for the first gate structure 125. In some embodiments, the conductive material for the first gate structure 125 is different from that for the second gate structure 135 so as to permit the first and second transistor structures 12, 13 to have different threshold voltages. Materials suitable for the second channel features 132, the second interfacial layers 133, and the second gate dielectric layers 134 may be the same as or similar to those for the first channel features 122, the first interfacial layers 123, and the first gate dielectric layers 124, respectively, and thus the details thereof are omitted for the sake of brevity. In addition, the second transistor structure 13 may have a configuration similar to that of the first transistor structure 12 described above, and thus the details thereof are omitted for the sake of brevity.

The CESL 16 is formed to cover the front side of the substrate 11, the first epitaxial structures 121 of the first transistor structure 12, and the second epitaxial structures 131 (one of which is schematically shown in FIG. 3) of the second transistor structure 13. In some embodiments, the CESL 16 may include a suitable low-k material selected from the examples described above, a suitable high-k material selected from the examples described above, a combination thereof, or other suitable materials.

The dielectric layer 17 is disposed on the CESL 16. In some embodiments, the dielectric layer 17 may include a suitable low-k material selected from the examples described above, or other suitable materials.

The multilayer etch stop structure 18 may include a stack assembly of at least one first etch stop layer 181 and at least one second etch stop layer 182 which are alternately stacked on the dielectric layer 17. In some embodiments, the number of the at least one first etch stop layer 181 is two, and the number of the at least one second etch stop layer 182 is two, as illustrated in FIGS. 2 to 4. In some embodiments, the number of the at least one first etch stop layer 181 may be one, and the number of the at least one second etch stop layer 182 may be one. Each of the first and second etch stop layers 181, 182 may independently include a suitable low-k material selected from the examples described above, a suitable high-k material selected from the examples described above, a combination thereof, or other suitable materials.

Referring to the schematic layout view of FIG. 1 and the examples illustrated in FIGS. 2 and 4, the first metal contact 19 is formed on one of the first epitaxial structures 121 and a corresponding one of the second epitaxial structures 131 (one of which is shown in FIG. 3), so as to interconnect the one of the first epitaxial structures 121 and the corresponding one of the second epitaxial structures 131. The second metal contact 20 is formed on the first metal contact 19. The third metal contact 21 is formed on the first gate structure 125 and the second gate structure 135. In some embodiments, each of the first metal contact 19, the second metal contact 20, and the third metal contact 21 may independently include a metal material, for example, but not limited to, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), molybdenum (Mo), or the like, or alloys thereof, which have good conductivity. Other suitable conductive materials are within the contemplated scope of the present disclosure.

Referring to the examples illustrated in FIGS. 2 to 4, the semiconductor device 200 further includes a first back-side via structure 14 and a second back-side via structure 15 extending from a second side of the substrate 11 opposite to the first side of the substrate 11 and penetrating through the substrate 11 so as to be connected to one of the first epitaxial structures 121 and one of the second epitaxial structures 131, respectively. In some embodiments, the first back-side via structure 14 and the second back-side via structure 15 extend from a back side of the substrate 11. A back-side power rail disposed below the back side of the substrate 11 can be connected to the one of the first epitaxial structures 121 and the one of the second epitaxial structures 131 through the first back-side via structure 14 and the second back-side via structure 15, respectively. Routing freedom of the semiconductor device 200 can be enhanced with the provision of the first back-side via structure 14 and the second back-side via structure 15. The first back-side via structure 14 is formed with a recessed surface 141 which is configured to be connected to a lower portion of the one of the first epitaxial structures 121 and which is recessed inwardly from an upper surface 142 of the first back-side via structure 14. The recessed surface 141 is configured as a U-shaped surface, and has a bottom surface portion 141a connected to a bottom surface of the lower portion of the one of the first epitaxial structures 121, and a first sidewall surface portion 141b and a second sidewall surface portion 141c extending between the upper surface 142 of the first back-side via structure 14 and the bottom surface portion 141a of the recessed surface 141 and respectively connected to a first lateral surface and a second lateral surface of the lower portion of the one of the first epitaxial structures 121. The first lateral surface and the second lateral surface are opposite to each other in the channel width direction (W). Therefore, the lower portion of the one of the first epitaxial structures 121 is wrapped around by the recessed surface 141 of the first back-side via structure 14. The bottom surface portion 141a of the recessed surface 141 is configured as a flat surface, and each of the first sidewall surface portion 141b and the second sidewall surface portion 141c is configured as a curved sidewall surface. The bottom surface portion 141a of the recessed surface 141 and the upper surface 142 of the first back-side via structure 14 have a distance D1 therebetween. The first back-side via structure 14 has a width W1 in the channel width direction (W). In other words, the first back-side via structure 14 includes two opposite lateral surfaces 143 which have the width W1 therebetween in the channel width direction (W). The recessed surface 141 has a horizontal width W2 in the channel width direction (W). Each of the first chancel features 122 and the second channel features 132 has a width W3 in the channel width direction (W). In some embodiments, a ratio of the horizontal width W2 to the distance D1 ranges from about 1 to about 30. The width W1 is greater than the width W3, and a difference in value between the width W1 and the width W3 ranges from about 2 nanometers (nm) to about 20 nm. An upper portion of the first back-side via structure 14 is inserted into the one of the first epitaxial structures 121 by a depth H1. In some embodiments, the depth H1 ranges from about 2 nm to about 10 nm. In some embodiments, the second back-side via structure 15 has a configuration and dimension requirements the same as those described above for the first back-side via structure 14, and thus the details thereof are omitted for the sake of brevity. In some embodiments, each of the first back-side via structure 14 and the second back-side via structure 15 may independently include a conductive material, for example, but not limited to, Cu, Al, Au, Ag, W, Co, Ru, Ir, Pt, Ni, Pd, Os, Mo, or the like, or alloys thereof, which have good conductivity. Other suitable conductive materials are within the contemplated scope of the present disclosure.

In some embodiments, the first back-side via structure 14 includes a main body 14a formed with the bottom surface portion 141a of the recessed surface 141, a first protrusion portion 14b formed with the first sidewall surface portion 141b of the recessed surface 141, and a second protrusion portion 14c formed with the second sidewall surface portion 141c of the recessed surface 141. The first protrusion portion 14b and the second protrusion portion 14c extend upwardly from the main body 14a, are separated from each other by the lower portion of the one of the first epitaxial structures 121, and laterally cover the lower portion of the one of the first epitaxial structures 121.

In addition, in some embodiments, the semiconductor device 200 may further include a first pair of sidewall spacers 22 disposed on the upper surface 142 of the first back-side via structure 14 to laterally cover the lower portion of the one of the first epitaxial structures 121, and a second pair of the sidewall spacers 22 disposed on an upper surface 152 of the second back-side via structure 15 to laterally cover the lower portion of the one of the second epitaxial structures 131. In some embodiments, the sidewall spacers 22 may include a suitable low-k material selected from the examples described above, a suitable high-k material selected from the examples described above, a combination thereof, or other suitable materials.

Figure 5:
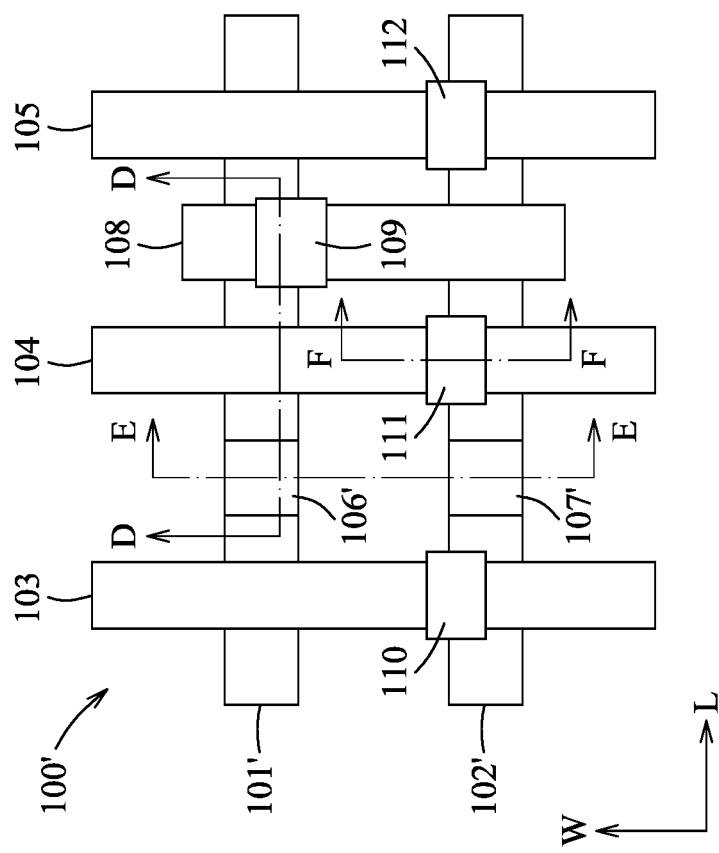
FIG. 5 is a schematic layout view of a standard cell.

FIG. 5 is a schematic layout view of a standard cell 100', which is substantially the same as that of the standard cell 100 depicted in FIG. 1 in accordance with some embodiments, except that in the layout of the standard cell 100', metal layout patterns 106', 107' have critical dimensions the same as those of first and second active region layout patterns 101', 102', respectively, in the channel width direction (W).

Figure 6:
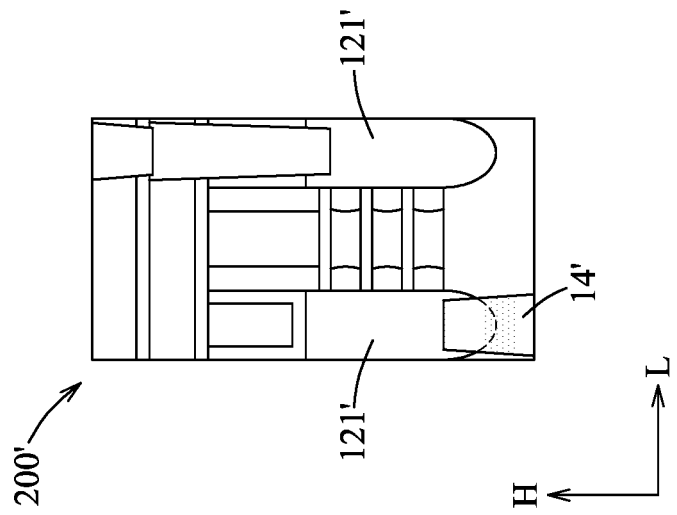
FIGS. 6 to 8 are schematic views of a semiconductor device manufactured according to the layout depicted in FIG. 5 and taken along reference lines D-D, E-E, F-F of FIG. 5, respectively.
Figure 8:
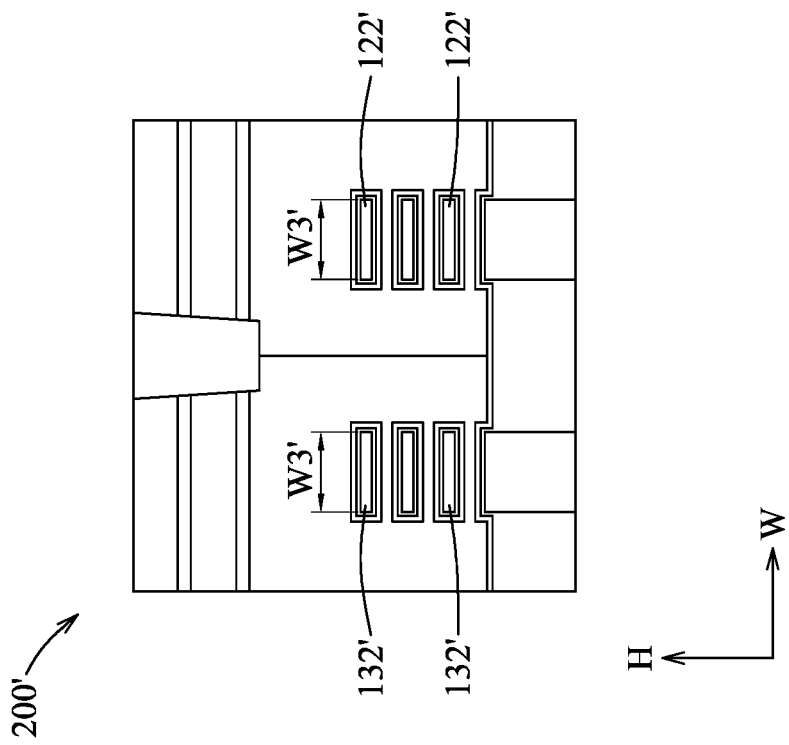
Figure 7:
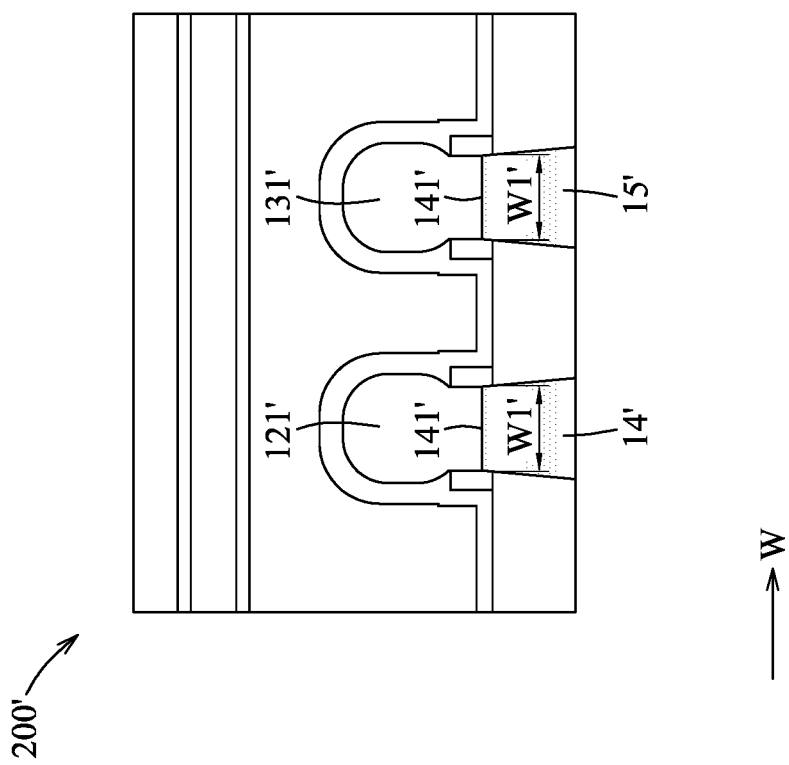

FIGS. 6 to 8 are schematic views of a semiconductor device 200' manufactured according to the layout depicted in FIG. 5 and taken along reference lines D-D, E-E, F-F of FIG. 5, respectively. The semiconductor device 200' has a configuration similar to that of the semiconductor device 200 illustrated in FIGS. 2 to 4, except for the following differences.

A width W1' of a first back-side via structure 14' (or a second back-side via structure 15') in the channel width direction (W) is the same as a width W3' of each of first channel features 122' (or second channel features 132'). A surface 141' of the first back-side via structure 14' (or the second back-side via structure 15') connected to a bottom surface of a lower portion of a corresponding one of first epitaxial structures 121' (or second epitaxial structures 131') is configured as a flat surface.

Compared to the semiconductor device 200' illustrated in FIGS. 6 to 8 in which the width W1' of the first back-side via structure 14' (or the second back-side via structure 15') in the channel width direction (W) is the same as the width W3' of each of the first chancel features 122' (or the second chancel features 132'), in the semiconductor device 200 illustrated in FIGS. 2 to 4 in accordance with some embodiments, the width W1 of the first back-side via structure 14 (or the second back-side via structure 15) in the channel width direction (W) is increased to be greater than the width W3 of each of the first channel features 122 (or the second channel features 132). Therefore, the resistance of the first back-side via structure 14 (or the second back-side via structure 15) can be reduced compared to that of the first back-side via structure 14' (or the second back-side via structure 15'). As described above, in some embodiments, the difference in value between the width W1 and the width W3 ranges from about 2 nm to about 20 nm. If the difference in value between the width W1 and the width W3 is less than 2 nm, the resistance of the first back-side via structure 14 (or the second back-side via structure 15) cannot be reduced significantly. In addition, compared to the semiconductor device 200' illustrated in FIGS. 6 to 8 in which the surface 141' of the first back-side via structure 14' (or the second back-side via structure 15') is configured as the flat surface connected to the bottom surface of the lower portion of the corresponding one of first epitaxial structures 121' (or second epitaxial structures 131'), in the semiconductor device 200 illustrated in FIGS. 2 to 4 in accordance with some embodiments, the recessed surface 141 of the first back-side via structure 14 (or the second back-side via structure 15) is configured as the U-shaped surface, and has the bottom surface portion 141a connected to the bottom surface of the lower portion of the one of the first epitaxial structures 121 (or the second epitaxial structures 131) and the first sidewall surface portion 141b and the second sidewall surface portion 141c respectively connected to the first lateral surface and the second lateral surface of the lower portion of the one of the first epitaxial structures 121 (or the second epitaxial structures 131). Therefore, the resistance between the first back-side via structure 14 (or the second back-side via structure 15) and the lower portion of the one of the first epitaxial structures 121 (or the second epitaxial structures 131) can be reduced by increasing the connecting area between the first back-side via structure 14 (or the second back-side via structure 15) and the lower portion of the one of the first epitaxial structures 121 (or the second epitaxial structures 131). Furthermore, as described above, the upper portion of the first back-side via structure 14 (or the second back-side via structure 15) is inserted into the one of the first epitaxial structures 121 (or the second epitaxial structures 131) by the depth H1 ranging from about 2 nm to about 10 nm. If the depth H1 is less than 2 nm, the connecting area between the first back-side via structure 14 (or the second back-side via structure 15) and the lower portion of the one of the first epitaxial structures 121 (or the second epitaxial structures 131) cannot be increased significantly.

Figure 10:
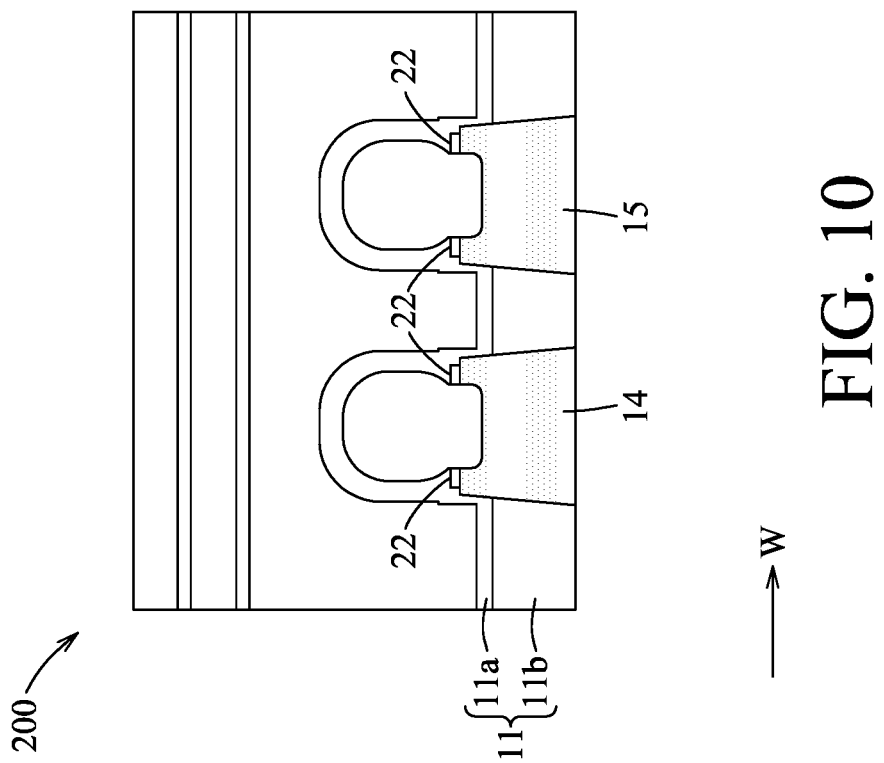
FIGS. 9 to 11 are schematic views of a semiconductor device manufactured according to the layout depicted in FIG. 1 and taken along reference lines A-A, B-B, C-C of FIG. 1, respectively, in accordance with some embodiments.
Figure 9:
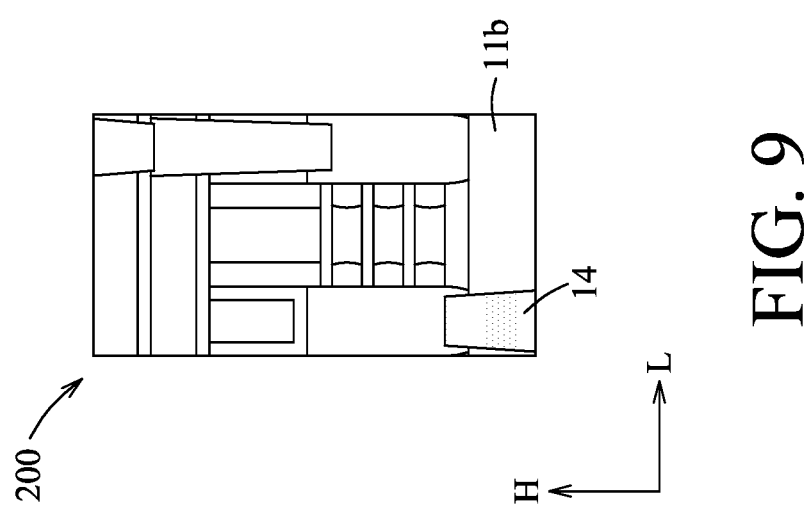
Figure 11:
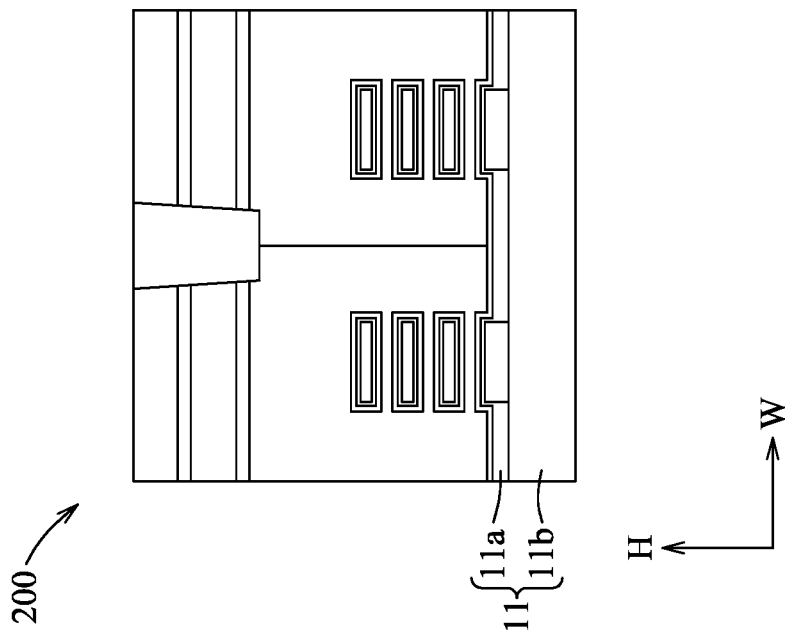

FIGS. 9 to 11 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 9 to 11 has a configuration similar to that of the semiconductor device 200 illustrated in FIGS. 2 to 4, except for the following differences.

The substrate 11 includes an upper semiconductor sub-layer 11a and a lower dielectric sub-layer 11b disposed below the upper semiconductor sub-layer 11a. In some embodiments, the upper semiconductor sub-layer 11a may include the elemental semiconductor or the compound semiconductor described above with reference to FIGS. 2 to 4. In some embodiments, the lower dielectric sub-layer 11b may include, for example, but not limited to, a suitable low-k dielectric material (for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), silicon carbide (SiC), or combinations thereof), or other suitable dielectric materials.

Figure 12:
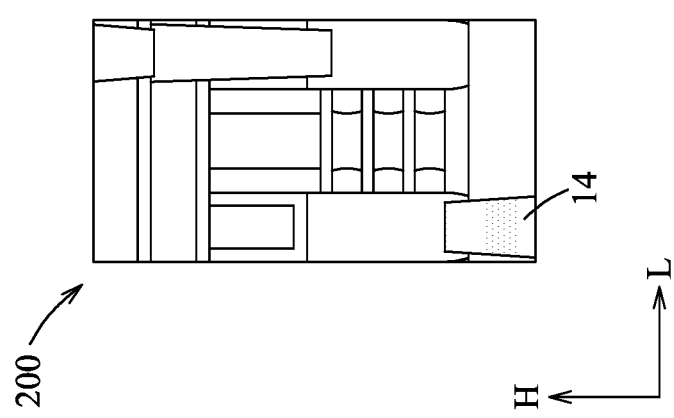
FIGS. 12 to 14 are schematic views of a semiconductor device manufactured according to the layout depicted in FIG. 1 and taken along reference lines A-A, B-B, C-C of FIG. 1, respectively, in accordance with some embodiments.
Figure 14:
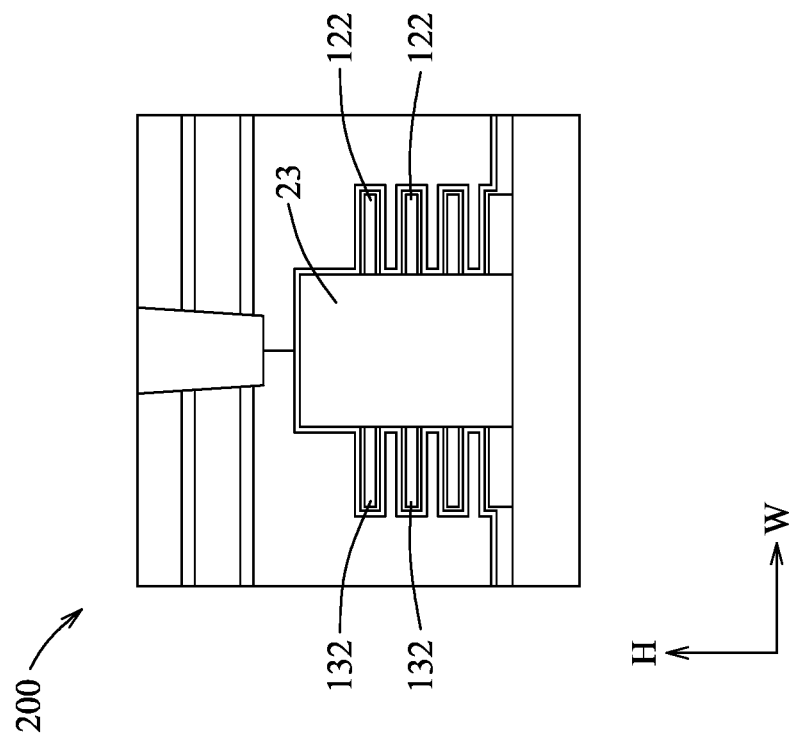
Figure 13:
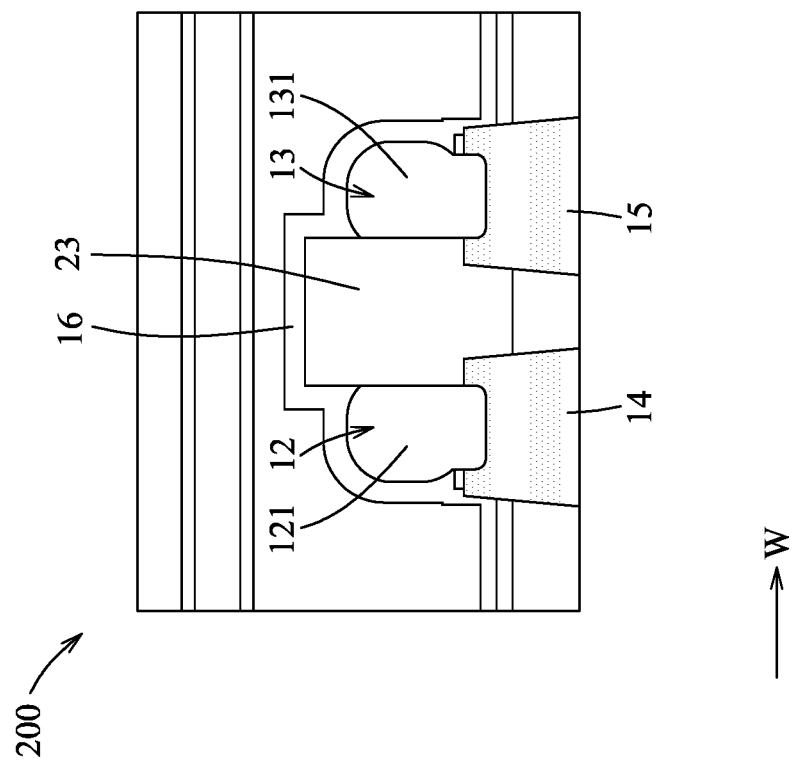

FIGS. 12 to 14 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 12 to 14 has a configuration similar to that of the semiconductor device 200 illustrated in FIGS. 9 to 11, except for the following differences.

The semiconductor device 200 illustrated in FIGS. 12 to 14 further includes a separating wall 23 disposed to separate the first epitaxial structures 121 from the second epitaxial structures 131 and to separate the first channel features 122 from the second chancel features 132 in the channel width direction (W). Portions of the separating wall 23 are covered by the CESL 16. In some embodiments, the separating wall 23 may include a suitable dielectric material (for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), silicon carbide (SiC), or combinations thereof), or other suitable materials.

Figure 16:
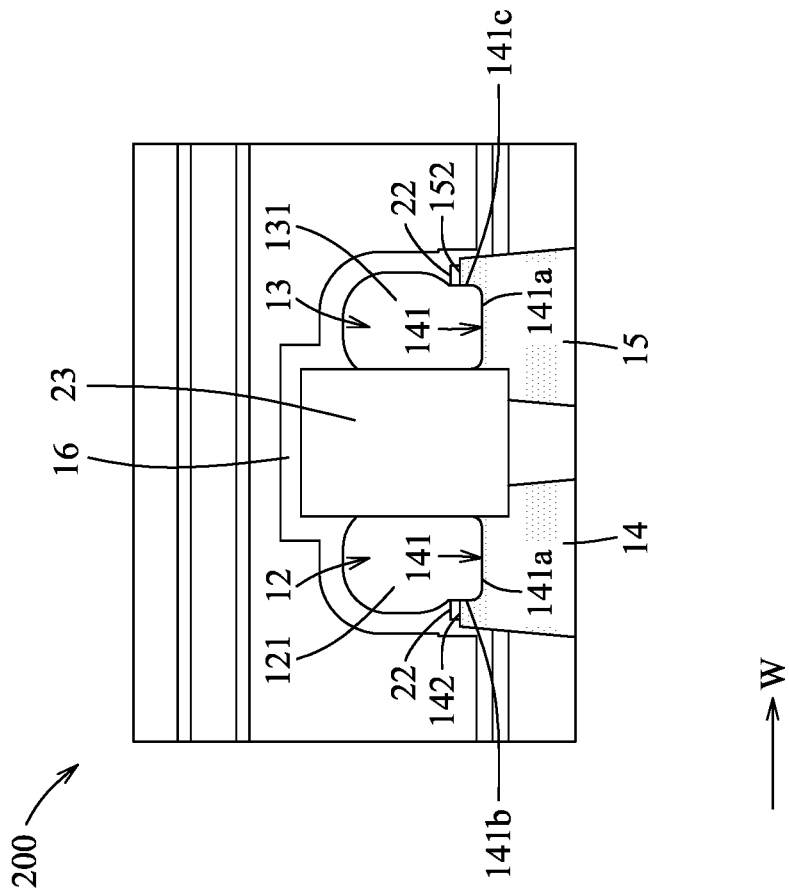
FIGS. 15 to 17 are schematic views of a semiconductor device manufactured according to the layout depicted in FIG. 1 and taken along reference lines A-A, B-B, C-C of FIG. 1, respectively, in accordance with some embodiments.
Figure 15:
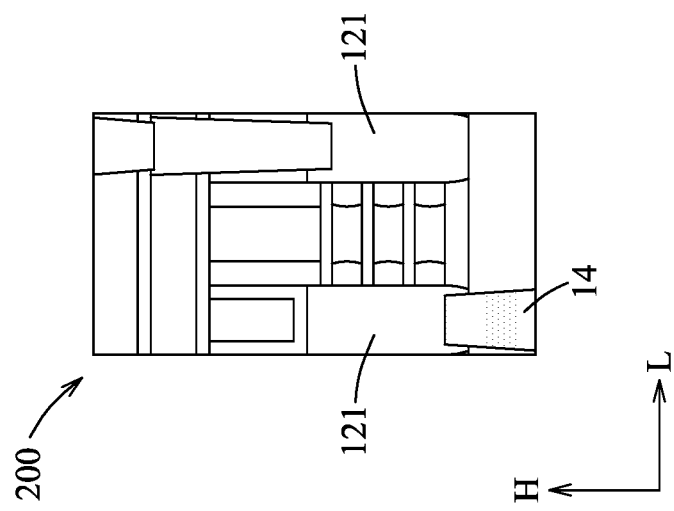
Figure 17:
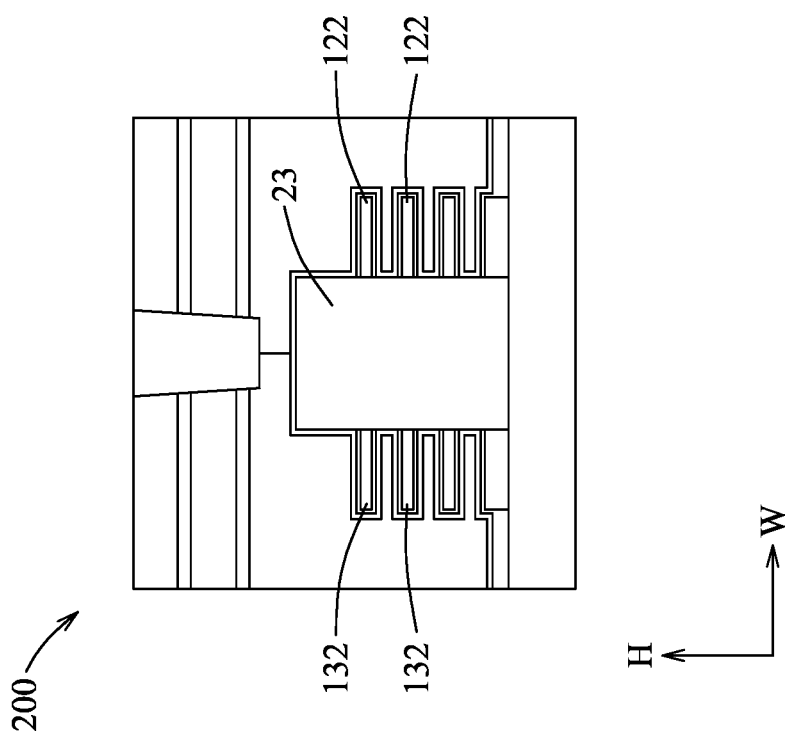

FIGS. 15 to 17 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 15 to 17 has a configuration similar to that of the semiconductor device 200 illustrated in FIGS. 12 to 14, except for the following differences.

In the semiconductor device 200 illustrated in FIGS. 15 to 17, the recessed surface 141 of the first back-side via structure 14 is configured as an L-shaped surface, and has the bottom surface portion 141a connected to the bottom surface of the lower portion of the one of the first epitaxial structures 121, and the first sidewall surface portion 141b extending between the upper surface 142 of the first back-side via structure 14 and the bottom surface portion 141a of the recessed surface 141 of the first back-side via structure 14 and connected to the first lateral surface of the lower portion of the one of the first epitaxial structures 121. The recessed surface 141 of the second back-side via structure 15 is configured as a reverse L-shaped surface, and has the bottom surface portion 141a connected to the bottom surface of the lower portion of the one of the second epitaxial structures 131, and the second sidewall surface portion 141c extending between the upper surface 152 of the second back-side via structure 15 and the bottom surface portion 141a of the recessed surface 141 of the second back-side via structure 15 and connected to the second lateral surface of the lower portion of the one of the second epitaxial structures 131.

Figure 18:
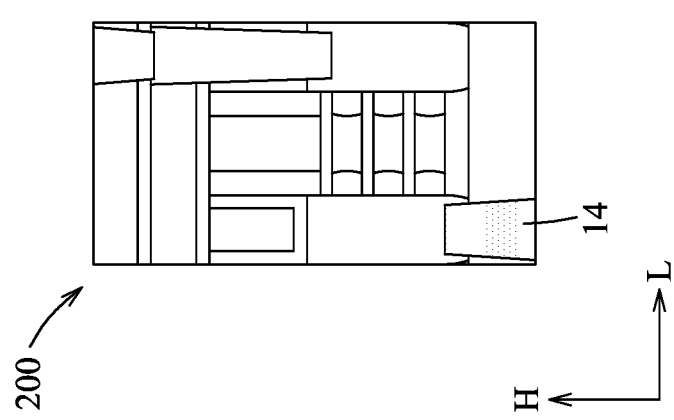
FIGS. 18 to 20 are schematic views of a semiconductor device manufactured according to the layout depicted in FIG. 1 and taken along reference lines A-A, B-B, C-C of FIG. 1, respectively, in accordance with some embodiments.
Figure 20:
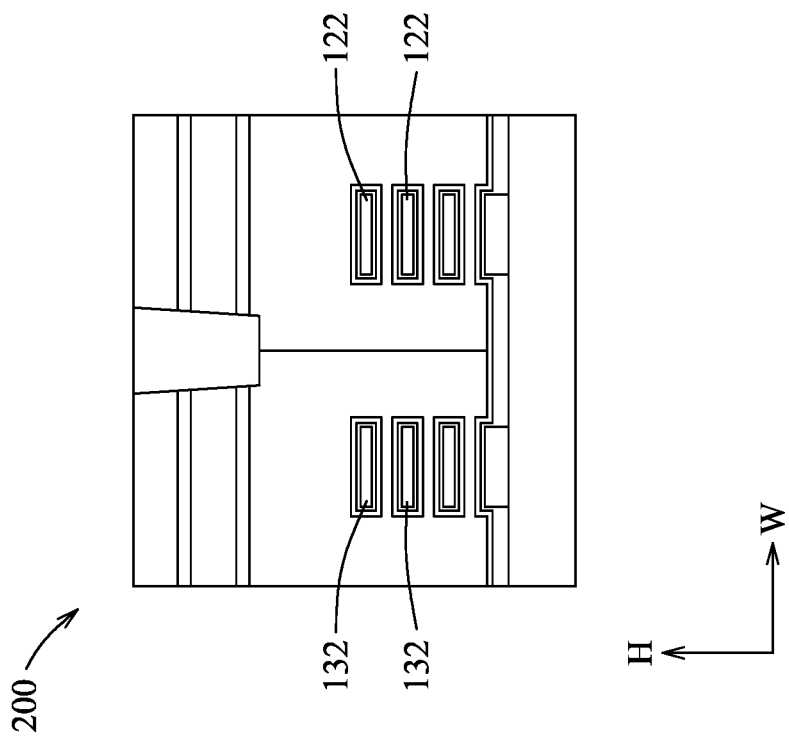
Figure 19:
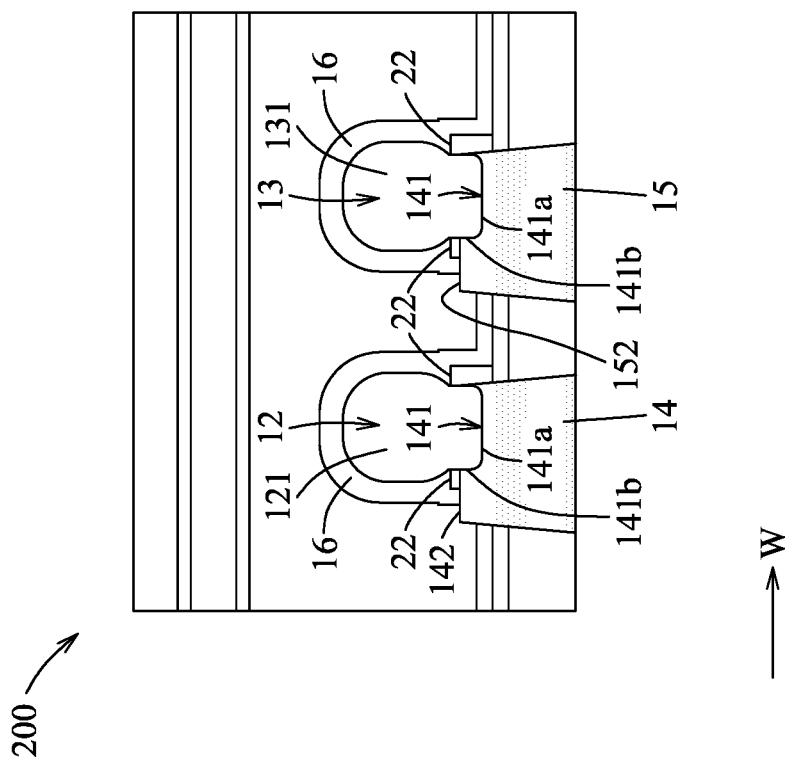

FIGS. 18 to 20 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 18 to 20 has a configuration similar to that of the semiconductor device 200 illustrated in FIGS. 9 to 11, except for the following differences.

In the semiconductor device 200 illustrated in FIGS. 18 to 20, one of the first pair of the sidewall spacers 22 is disposed on the upper surface 142 of the first back-side via structure 14 and the other one of the first pair of the sidewall spacers 22 is disposed to laterally cover the one of the first epitaxial structures 121 and the first back-side via structure 14, such that the recessed surface 141 of the first back-side via structure 14 is configured as the L-shaped surface described above with reference to FIG. 16 and such that the bottom surface portion 141a of the recessed surface 141 extends from the first sidewall surface portion 141b in the channel width direction (W) to terminate at the other one of the first pair of the sidewall spacers 22. One of the second pair of the sidewall spacers 22 is disposed on the upper surface 152 of the second back-side via structure 15 and the other one of the second pair of the sidewall spacers 22 is disposed to laterally cover the one of the second epitaxial structures 131 and the second back-side via structure 15, such that the recessed surface 141 of the second back-side via structure 15 is configured as the L-shaped surface described above with reference to FIG. 16 and such that the bottom surface portion 141a of the recessed surface 141 extends from the first sidewall surface portion 141b in the channel width direction (W) to terminate at the other one of the second pair of the sidewall spacers 22.

Figure 22:
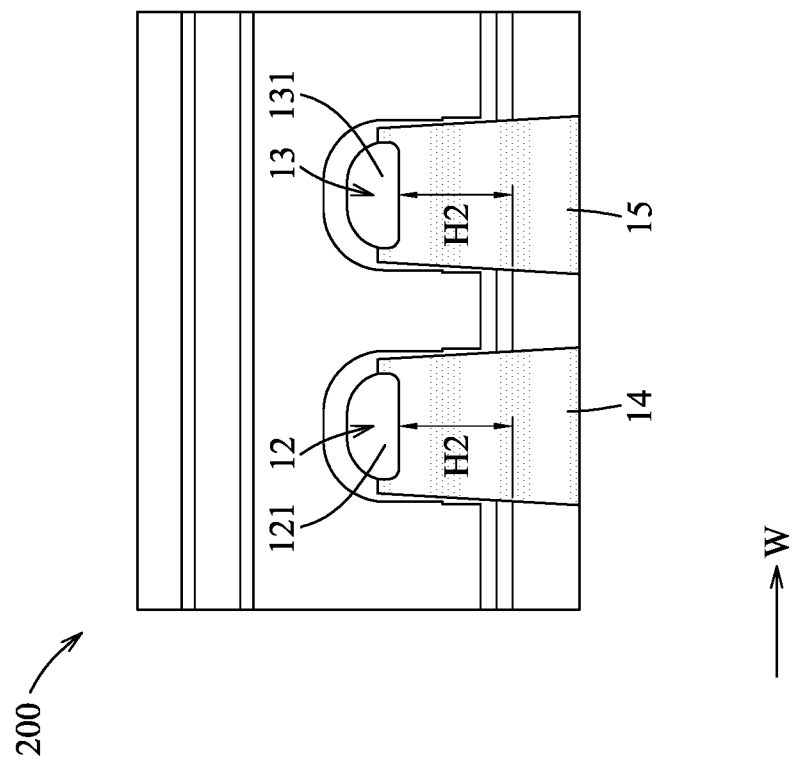
FIGS. 21 to 23 are schematic views of a semiconductor device manufactured according to the layout depicted in FIG. 1 and taken along reference lines A-A, B-B, C-C of FIG. 1, respectively, in accordance with some embodiments.
Figure 21:
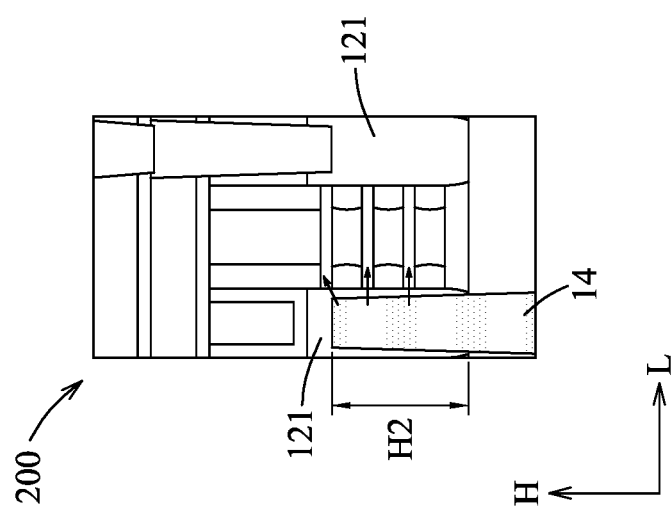
Figure 23:
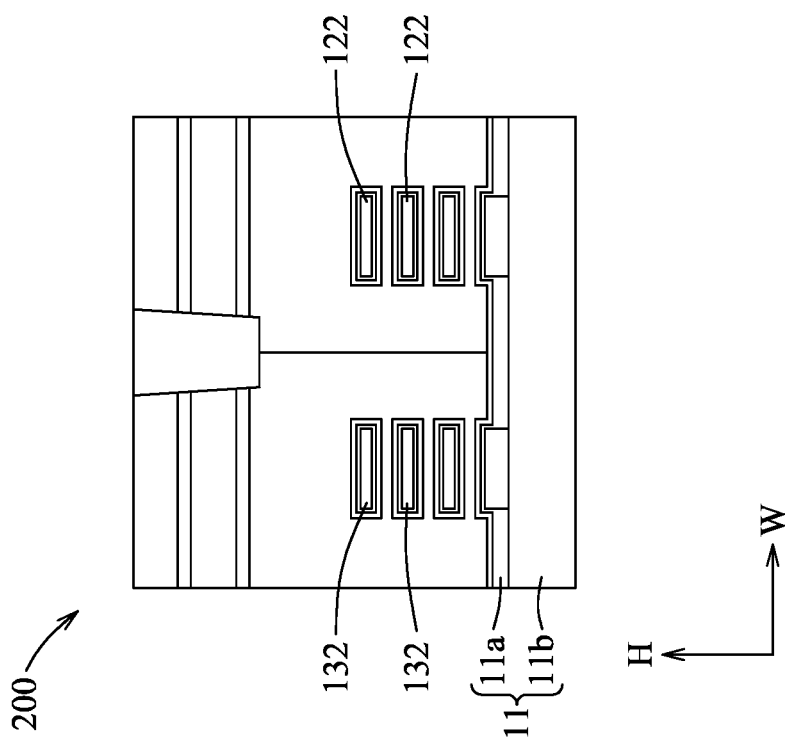

FIGS. 21 to 23 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 21 to 23 has a configuration similar to that of the semiconductor device 200 illustrated in FIGS. 9 to 11, except for the following differences.

In the semiconductor device 200 illustrated in FIGS. 21 to 23, an upper portion of the first back-side via structure 14 (or the second back-side via structure 15) is inserted into the one of the first epitaxial structures 121 (or the second epitaxial structures 131) by a depth H2, which is greater than the depth H1 described above with the reference to FIG. 2. In some embodiments, the depth H2 ranges from about 10 nm to about 60 nm. The spreading resistance produced through the one of the first epitaxial structures 121 (or the second epitaxial structures 131) can be reduced by increasing the depth of the upper portion of the first back-side via structure 14 (or the second back-side via structure 15) inserted into the one of the first epitaxial structures 121 (or the second epitaxial structures 131).

Figure 24:
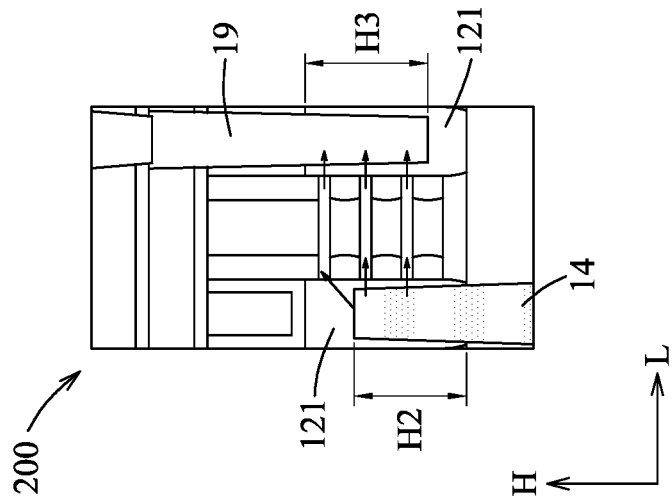
FIGS. 24 to 26 are schematic views of a semiconductor device manufactured according to the layout depicted in FIG. 1 and taken along reference lines A-A, B-B, C-C of FIG. 1, respectively, in accordance with some embodiments.
Figure 26:
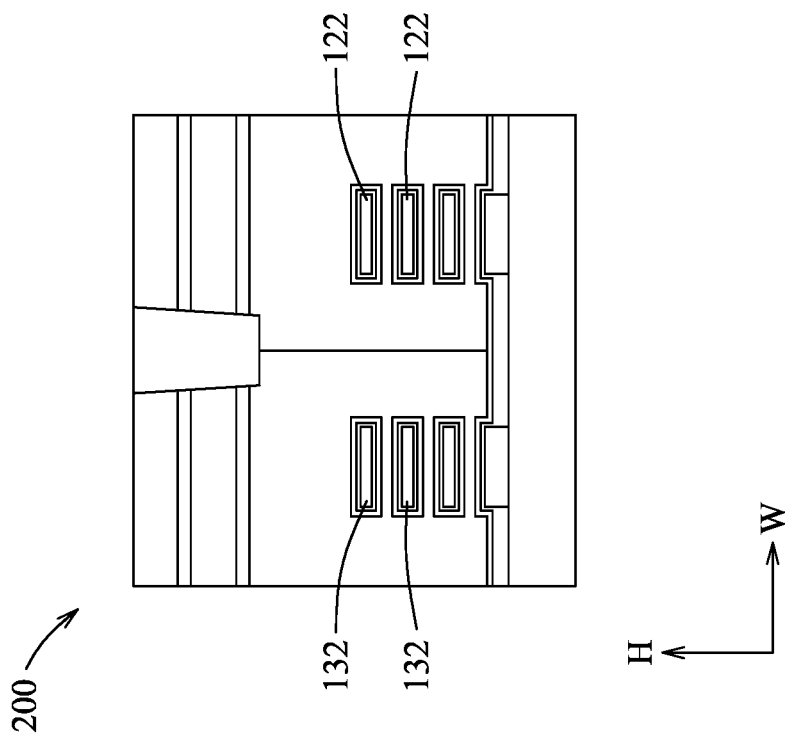
Figure 25:
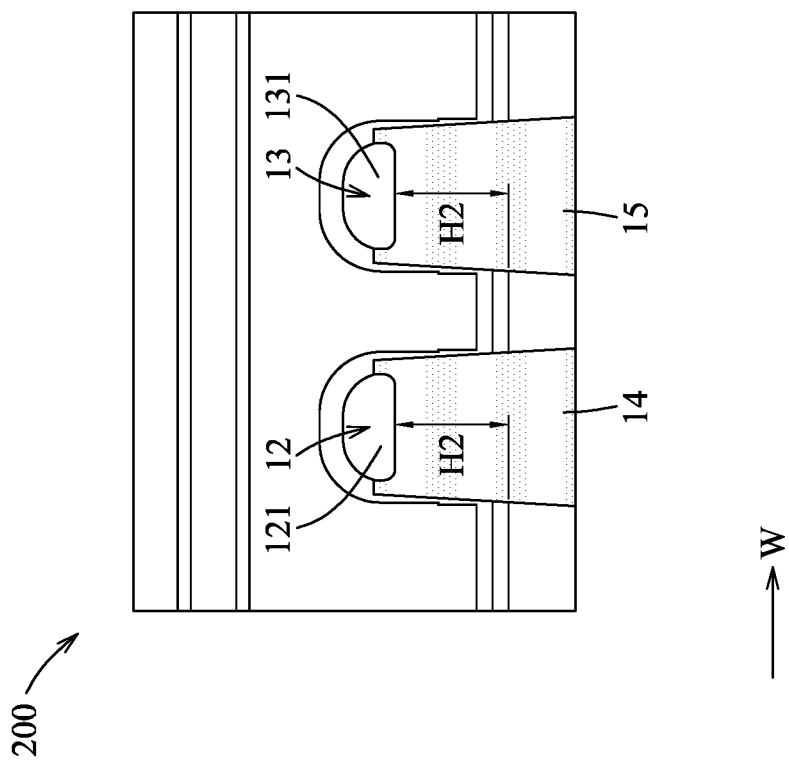

FIGS. 24 to 26 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 24 to 26 has a configuration similar to that of the semiconductor device 200 illustrated in FIGS. 21 to 23, except for the following differences.

In the semiconductor device 200 illustrated in FIGS. 24 to 26, a bottom portion of the first metal contact 19 is inserted into the other one of the first epitaxial structures 121 of the first transistor structure 12 by a depth H3. In some embodiments, the depth H3 ranges from about 10 nm to about 60 nm. The spreading resistance produced through the other one of the first epitaxial structures 121 can be reduced by increasing the depth of the lower portion of the first metal contact 19 inserted into the other one of the first epitaxial structures 121. In some embodiments, a ratio of the depth H2 to the depth H3 ranges from about 0.4 to about 2.5.

Figure 29:
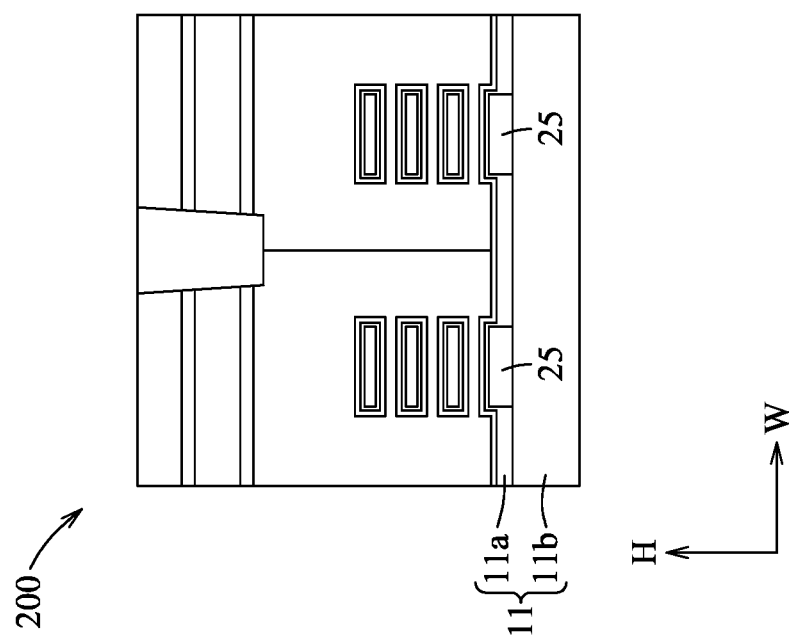

FIGS. 27 to 29 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 27 to 29 has a configuration similar to that of the semiconductor device 200 illustrated in FIGS. 9 to 11, except for the following differences.

In the semiconductor device 200 illustrated in FIGS. 27 to 29, a bottom dielectric layer 24 is formed below each of epitaxial structures (for example, the first epitaxial structures 121 as illustrated in FIG. 27), so as to isolate a bottom semiconductor layer 25 disposed below channel features (for example, the first channel features 122 as illustrated in FIG. 27) from the epitaxial structures and a back-side via structure (for example, the first back-side via structure 14 as illustrated in FIG. 27). In some embodiments, the bottom dielectric layer 24 may include, for example, but not limited to, a suitable low-k material selected from the examples described above, a suitable high-k material selected from the examples described above, a combination thereof, or other suitable materials. In some embodiments, the high-k material may have a k-value ranging from about 3.5 to about 10.0.

Figure 30:
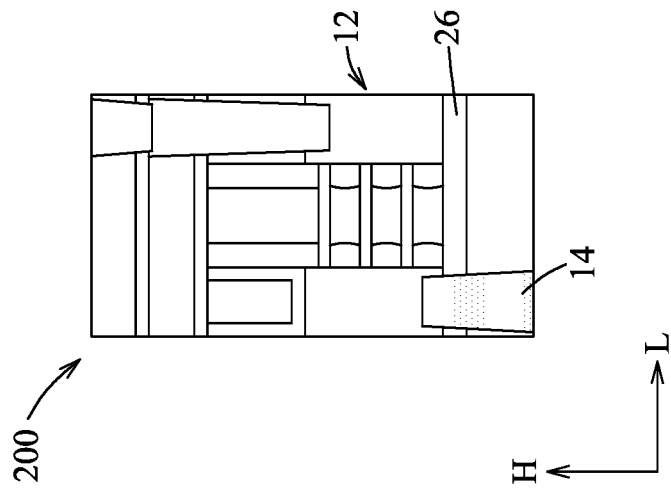
FIGS. 30 to 32 are schematic views of a semiconductor device manufactured according to the layout depicted in FIG. 1 and taken along reference lines A-A, B-B, C-C of FIG. 1, respectively, in accordance with some embodiments.
Figure 32:
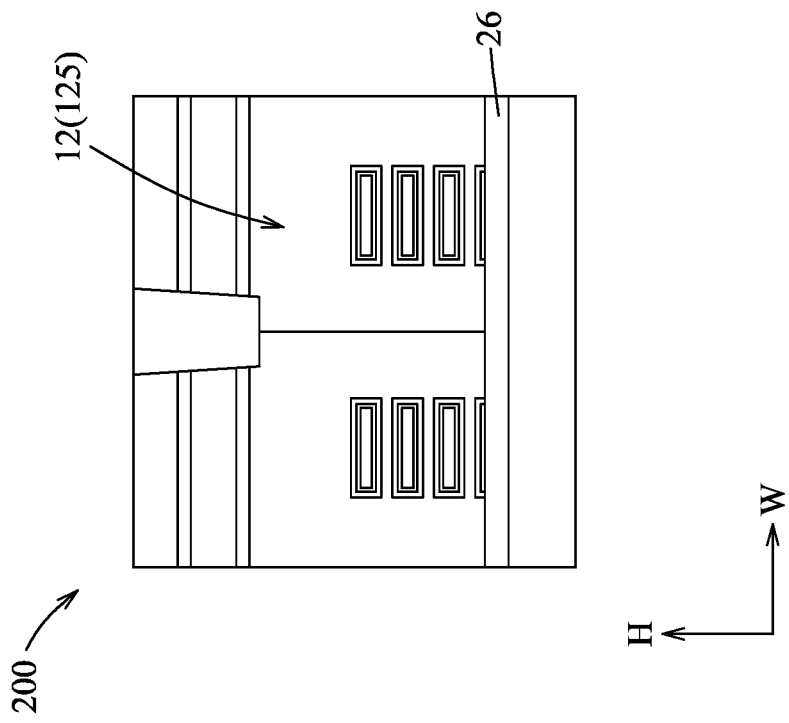
Figure 31:
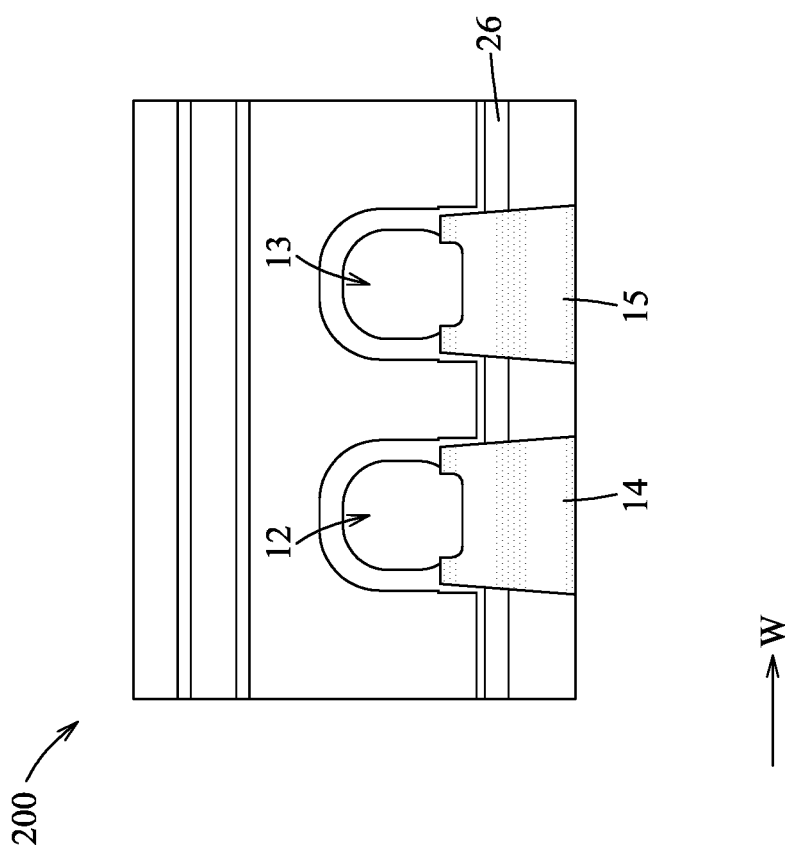

FIGS. 30 to 32 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 30 to 32 has a configuration similar to that of the semiconductor device 200 illustrated in FIGS. 9 to 11, except for the following differences.

In the semiconductor device 200 illustrated in FIGS. 30 to 32, a bottom dielectric layer 26 is formed in oxide definition (OD) regions (for example, but not limited to, the first active region layout pattern 101, the second active region layout pattern 102, and the polysilicon layout patterns 103, 104, 105 shown in FIG. 1) for forming transistor structures. In some embodiments, the bottom dielectric layer 26 may include, for example, but not limited to, a suitable dielectric material the same as or similar to that described above for the bottom dielectric layer 24 with reference to FIG. 27.

Figure 34:
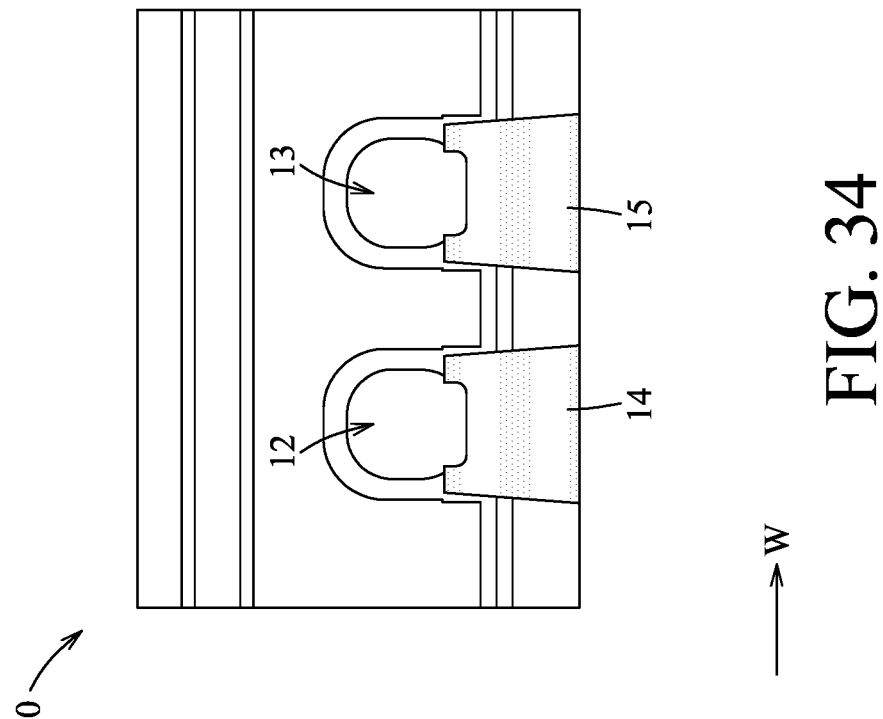
FIGS. 33 to 35 are schematic views of a semiconductor device manufactured according to the layout depicted in FIG. 1 and taken along reference lines A-A, B-B, C-C of FIG. 1, respectively, in accordance with some embodiments.
Figure 33:
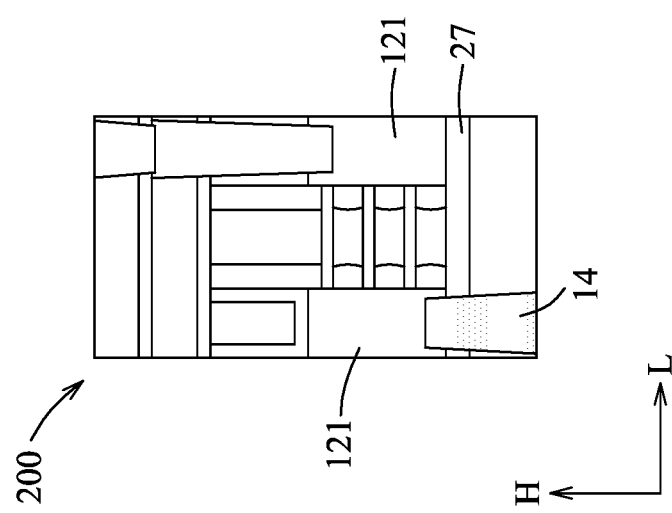
Figure 35:
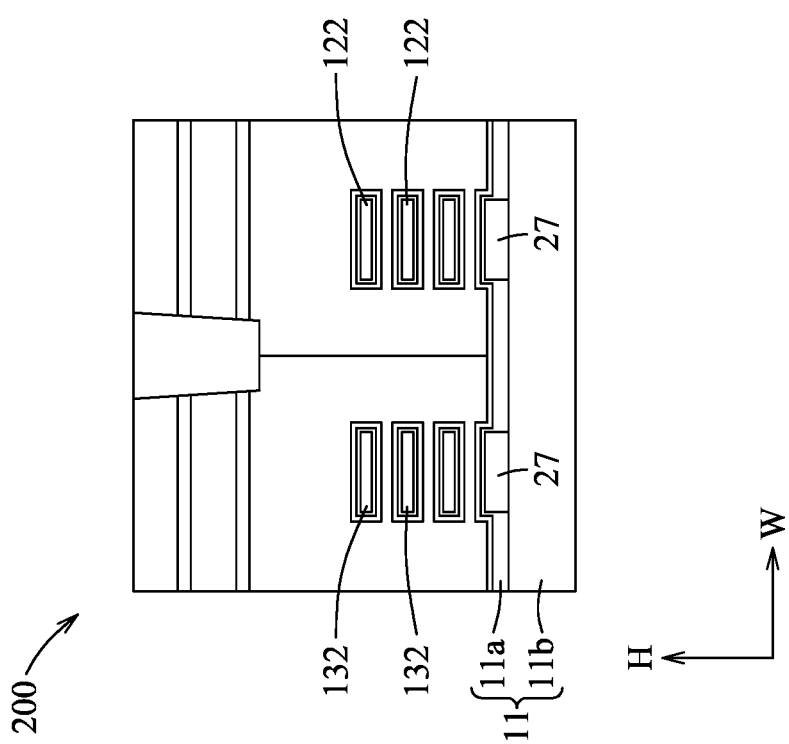

FIGS. 33 to 35 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 33 to 35 has a configuration similar to that of the semiconductor device 200 illustrated in FIGS. 9 to 11, except for the following differences.

In the semiconductor device 200 illustrated in FIGS. 33 to 35, a bottom dielectric layer 27 is formed below channel features (for example, the first channel features 122 and the second chancel features 132 illustrated in FIG. 35) and epitaxial structures (for example, the first epitaxial structures 121 illustrated in FIG. 33). In some embodiments, the bottom dielectric layer 27 may include, for example, but not limited to, a suitable dielectric material the same as or similar to that described above for the bottom dielectric layer 24 with reference to FIG. 27.

Figure 36:
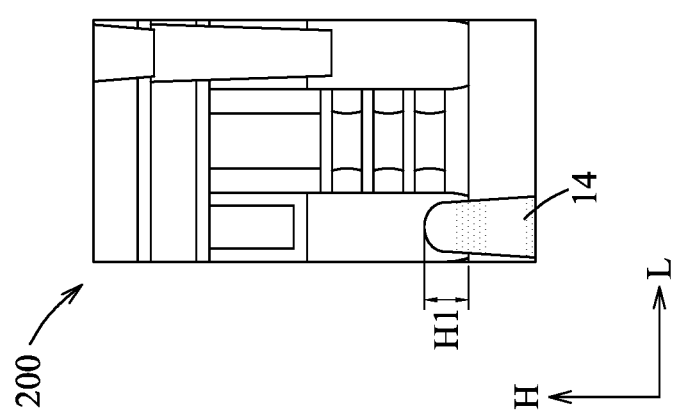
FIGS. 36 to 38 are schematic views of a semiconductor device manufactured according to the layout depicted in FIG. 1 and taken along reference lines A-A, B-B, C-C of FIG. 1, respectively, in accordance with some embodiments.
Figure 37:
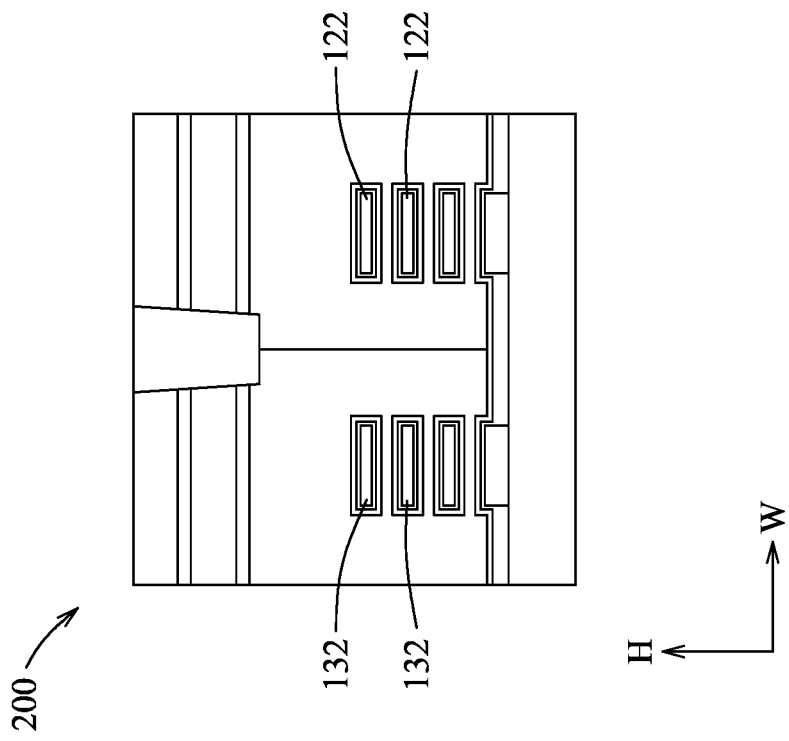
Figure 38:
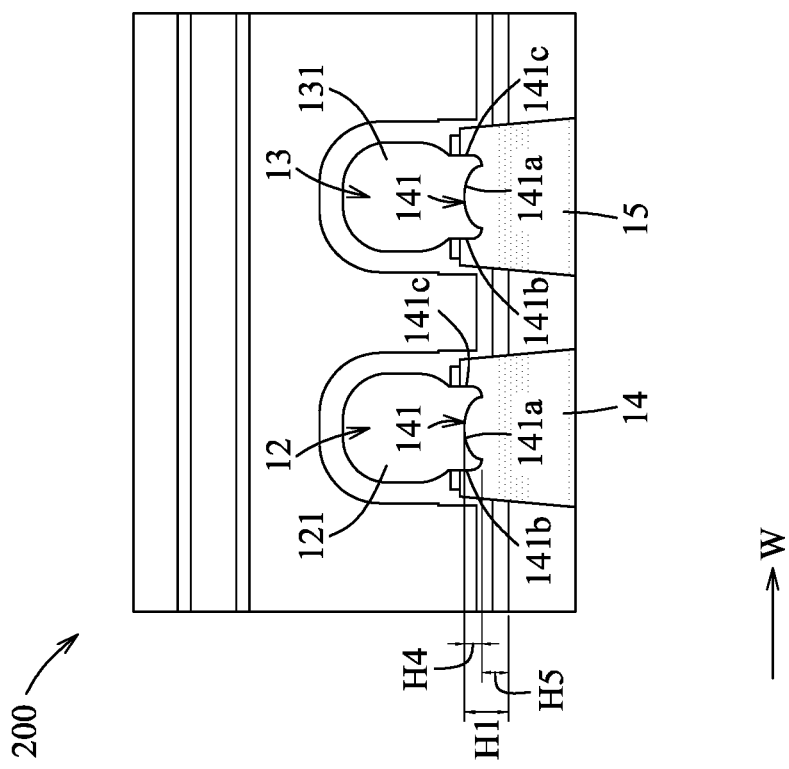

FIGS. 36 to 38 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 36 to 38 has a configuration similar to that of the semiconductor device 200 illustrated in FIGS. 9 to 11, except for the following differences.

In the semiconductor device 200 illustrated in FIGS. 36 to 38, the bottom surface portion 141a of the recessed surface 141 of the first back-side via structure 14 (or the second back-side via structure 15) is configured as a convex surface. The bottom surface portion 141a configured as the convex surface has a vertical height H4. A lower end of the first sidewall surface portion 141b (or the second sidewall surface portion 141c) and a lower end of the upper portion of the first back-side via structure 14 (or the second back-side via structure 15) inserted into the one of the first epitaxial structures 121 (or the second epitaxial structures 131) have a height H5 therebetween. In some embodiments, a ratio of H1 (i.e., the depth of the upper portion of the first back-side via structure 14 (or the second back-side via structure 15) inserted into the one of the first epitaxial structures 121 (or the second epitaxial structures 131)) to H4 ranges from about 1.5 to 3.0. In some embodiments, a ratio of H1 to H5 ranges from about 1.5 to 3.0.

Figure 41:
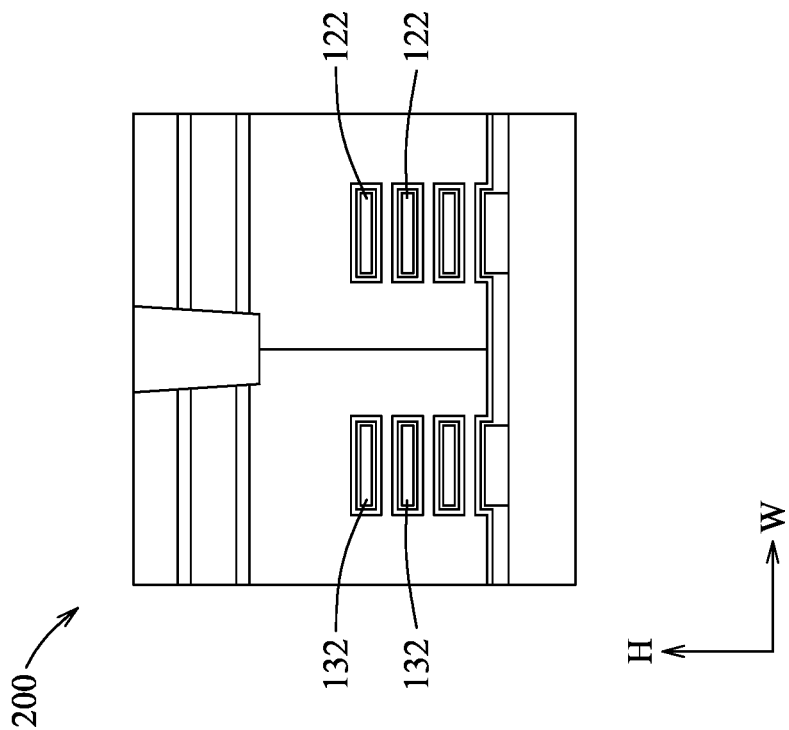

FIGS. 39 to 41 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 39 to 41 has a configuration similar to that of the semiconductor device 200 illustrated in FIGS. 9 to 11, except for the following differences.

In the semiconductor device 200 illustrated in FIGS. 39 to 41, the bottom surface portion 141a of the recessed surface 141 of the first back-side via structure 14 is configured as the convex surface, and the bottom surface portion 141a of the recessed surface 141 of the second back-side via structure 15 is configured as the flat surface, such that the first epitaxial structures 121, one of which is connected to the first back-side via structure 14, can be configured as N-type epitaxial structures, and such that the second epitaxial structures 131, one of which is connected to the second back-side via structure 15, can be configured as P-type epitaxial structures.

Figure 42:
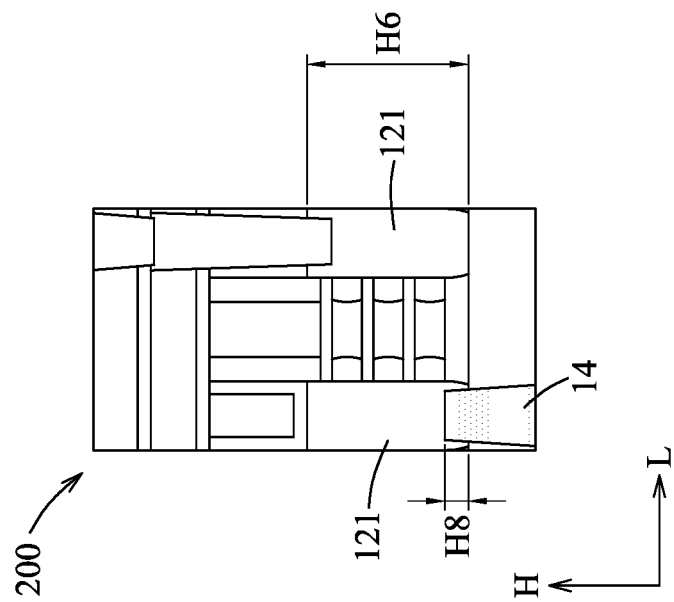
FIGS. 42 to 44 are schematic views of a semiconductor device manufactured according to the layout depicted in FIG. 1 and taken along reference lines A-A, B-B, C-C of FIG. 1, respectively, in accordance with some embodiments.
Figure 44:
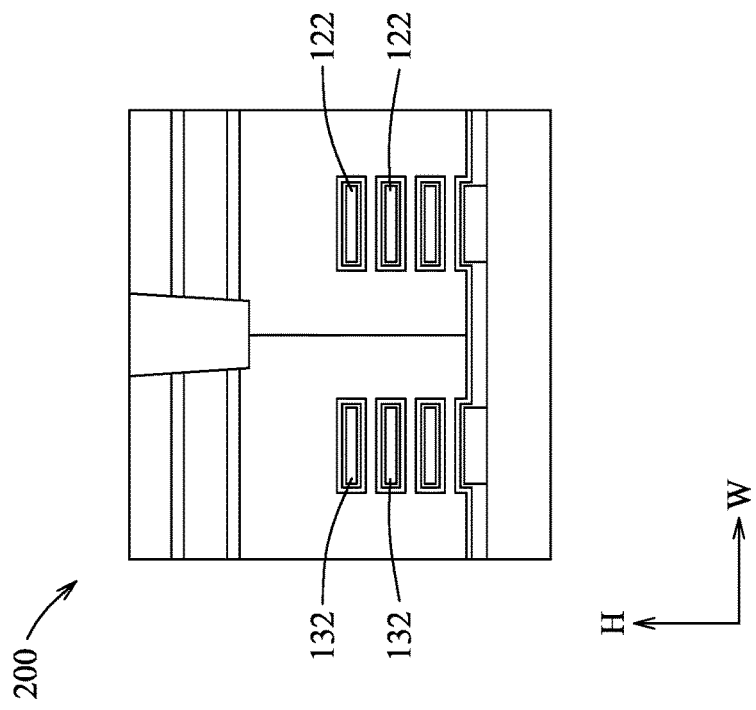
Figure 43:
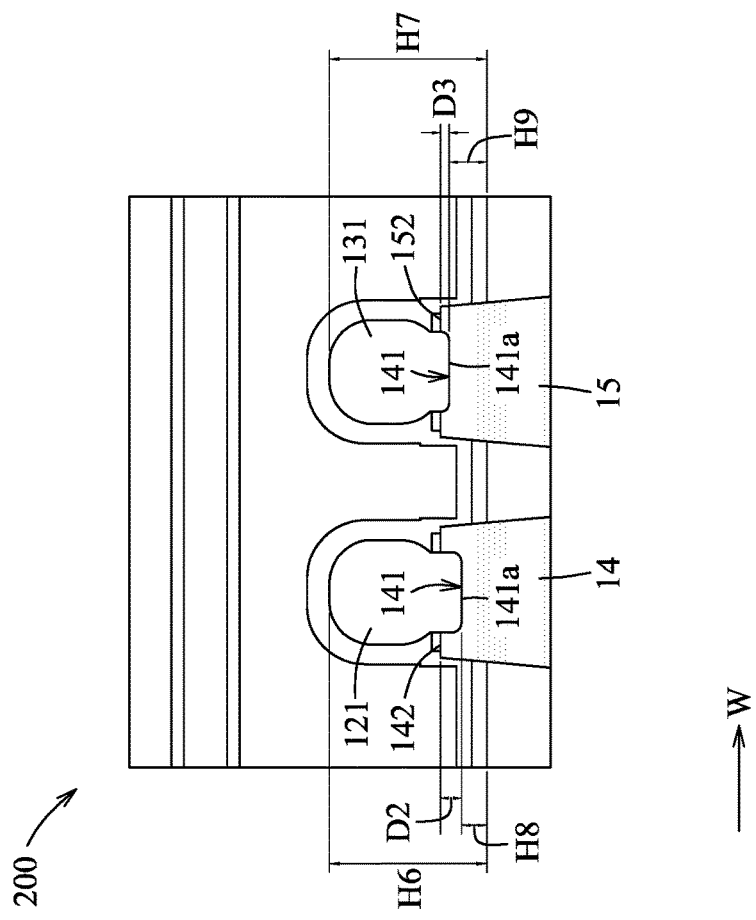

FIGS. 42 to 44 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 42 to 44 has a configuration similar to that of the semiconductor device 200 illustrated in FIGS. 9 to 11, except for the following differences.

In the semiconductor device 200 illustrated in FIGS. 42 to 44, the first epitaxial structures 121 have a height H6, and the second epitaxial structures 131 have a height H7. In some embodiments, a ratio of H6 to H7 ranges from about 0.7 to about 1.3. For the first back-side via structure 14, an upper portion of the first back-side via structure 14 is inserted into the one of the first epitaxial structures 121 by a depth H8. The bottom surface portion 141a of the recessed surface 141 of the first back-side via structure 14 and the upper surface 142 of the first back-side via structure 14 have a distance D2 therebetween. For the second back-side via structure 15, an upper portion of the second back-side via structure 15 is inserted into the one of the second epitaxial structures 131 by a depth H9. The bottom surface portion 141a of the recessed surface 141 of the second back-side via structure 15 and the upper surface 152 of the second back-side via structure 15 have a distance D3 therebetween. In some embodiments, a ratio of H8 to H9 ranges from about 0.5 to about 2.0. In some embodiments, a ratio of D2 to D3 ranges from about 0.2 to about 5.0. Therefore, the recessed surface 141 of the first back-side via structure 14 has an U-shaped configuration different from that of the recessed surface 141 of the second back-side via structure 15, such that the first epitaxial structures 121 can be configured as P-type epitaxial structures and the second epitaxial structures 131 can be configured as N-type epitaxial structures, or vice versa. In some embodiments, the depth H8 of the upper portion of the first back-side via structure 14 is less than the depth H9 of the upper portion of the second back-side via structure 15, such that the first epitaxial structures 121 are configured as the P-type epitaxial structures and the second epitaxial structures 131 are configured as the N-type epitaxial structures, thereby retaining an epitaxial strain of the P-type epitaxial structures and improving hole mobility of the P-type epitaxial structures.

Figure 46:
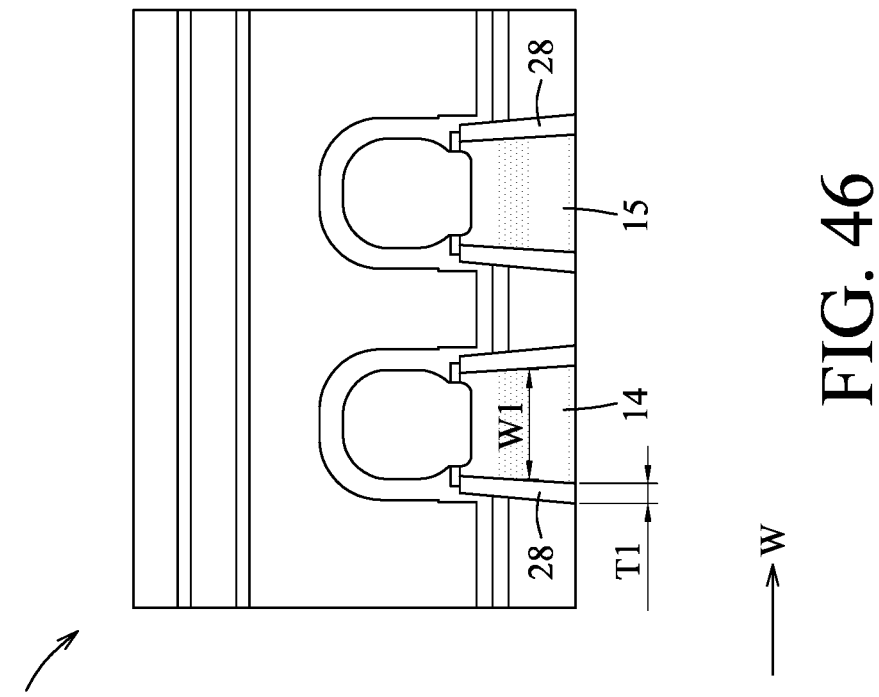
FIGS. 45 to 47 are schematic views of a semiconductor device manufactured according to the layout depicted in FIG. 1 and taken along reference lines A-A, B-B, C-C of FIG. 1, respectively, in accordance with some embodiments.
Figure 45:
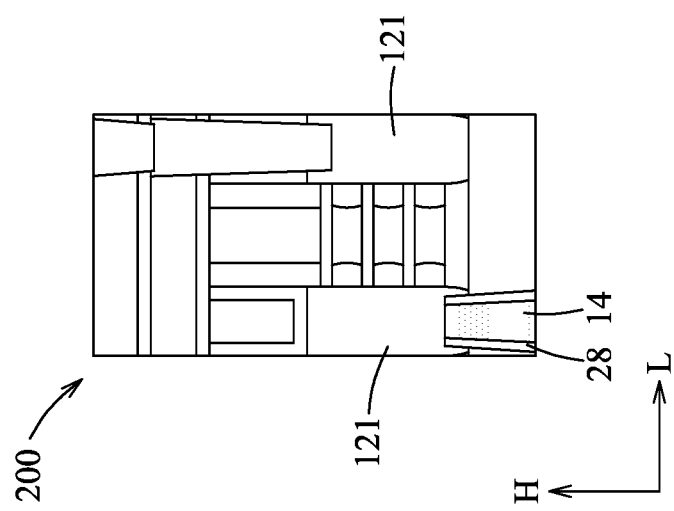
Figure 47:
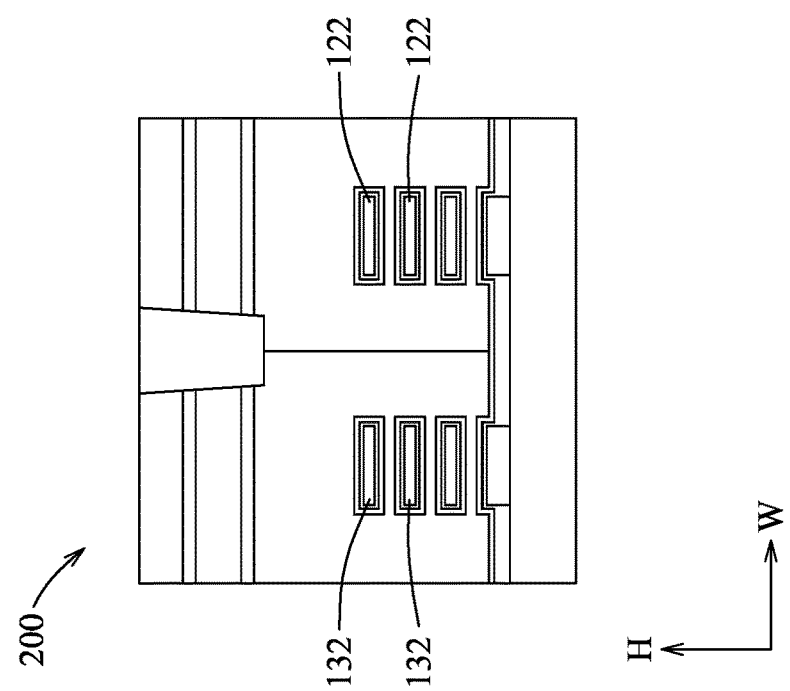

FIGS. 45 to 47 are schematic views of a semiconductor device 200 manufactured according to the layout depicted in FIG. 1 and taken along reference lines A-A, B-B, C-C of FIG. 1, respectively, in accordance with some embodiments. The semiconductor device 200 illustrated in FIGS. 45 to 47 has a configuration similar to that of the semiconductor device 200 illustrated in FIGS. 9 to 11, except for the following differences.

The semiconductor device 200 illustrated in FIGS. 45 to 47 further includes a dielectric isolation layer 28 which laterally covers each of the first back-side via structure 14 and the second back-side via structure 15. The dielectric isolation layer 28 has a thickness T1. As described above with reference to FIG. 3, each of the first back-side via structure 14 and the second back-side via structure 15 has the width W1 in the channel width direction (W). In some embodiments, a ratio of T1 to W1 ranges from about 0.01 to about 0.40. In some embodiments, the dielectric isolation layer 28 may include for example, a suitable low-k material selected from the examples described above, a suitable high-k material selected from the examples described above, a combination thereof, or other suitable materials. In some embodiments, the high-k material may have a k-value ranging from about 3.5 to about 10.0.

Figure 48:
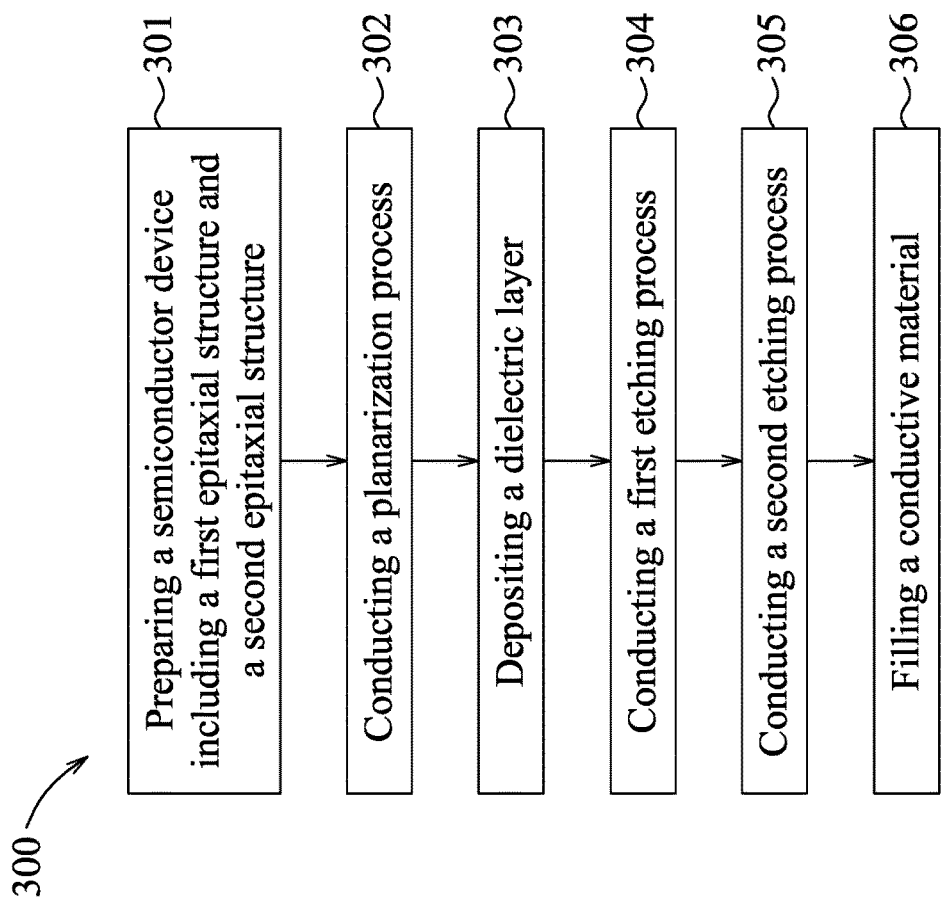
FIG. 48 is a flow diagram illustrating a method for manufacturing a semiconductor device in accordance with some embodiments.

FIG. 48 is a flow diagram illustrating a method 300 for manufacturing the semiconductor device 200 described above in accordance with some embodiments. FIGS. 49 to 63 are schematic views illustrating some intermediate stages of the method 300 as depicted in FIG. 48 in accordance with some embodiments. Additional steps can be provided before, after or during the method 300.

Figure 50:
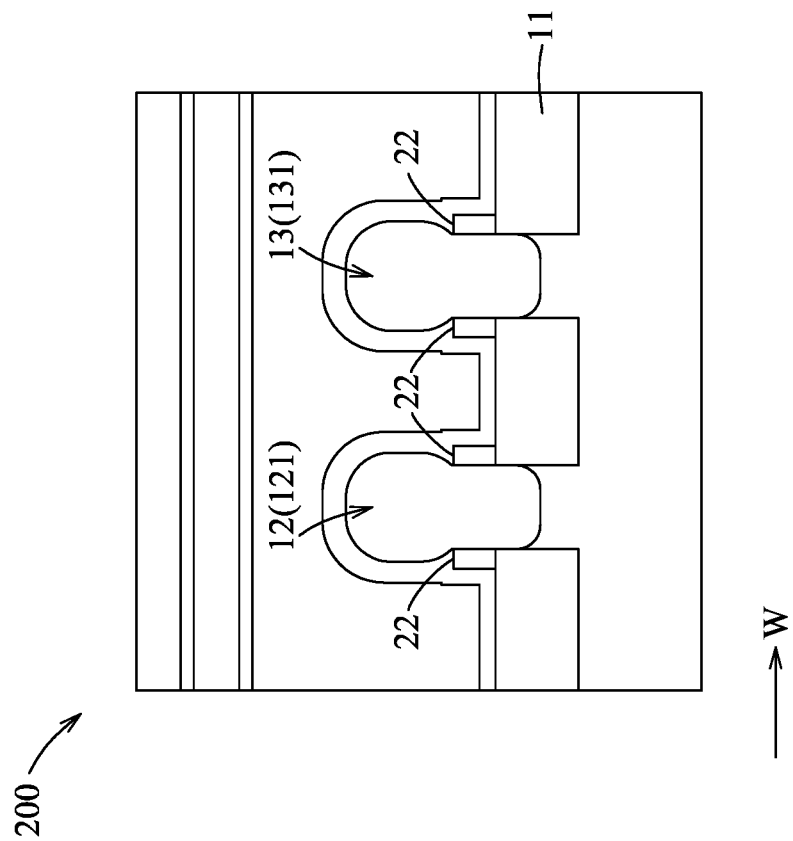
Figure 49:
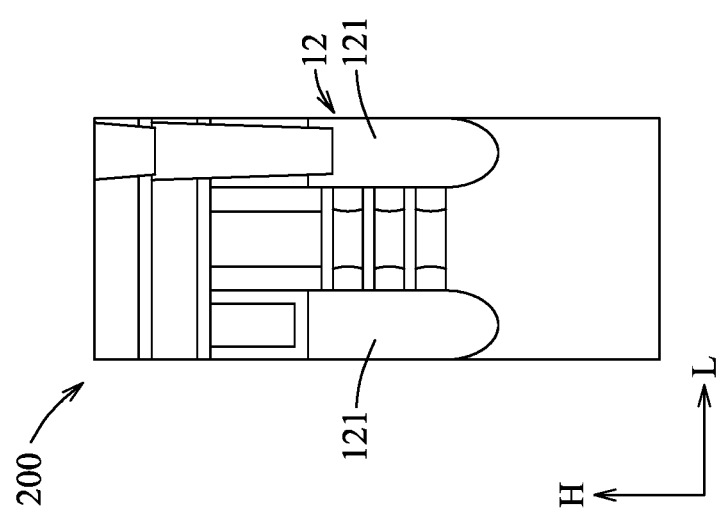
Figures 51, 52:
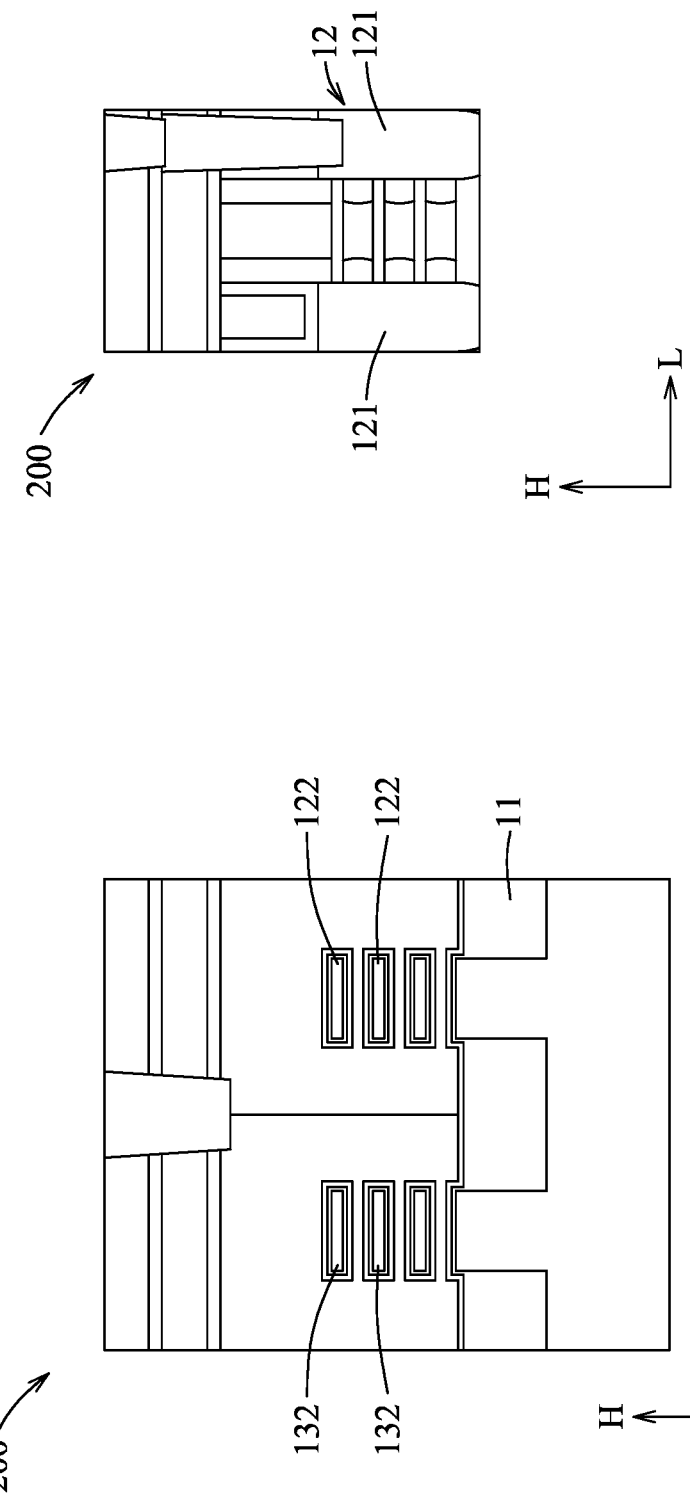

Referring to FIG. 48 and the example illustrated in FIGS. 49 to 51, the method 300 begins at step 301, where a semiconductor device including a first epitaxial structure and a second epitaxial structure is prepared. The semiconductor device 200 having a configuration illustrated in FIGS. 49 to 51 may be prepared using a fabrication process as is known to those skilled in the art of semiconductor fabrication. The semiconductor device 200 includes the substrate 11, the first transistor device 12, the second transistor device 13, and the sidewall spacers 22. Both of the first transistor device 12 and the second transistor device 13 are disposed on the front side of the substrate 11. The first transistor device 12 includes a pair of the first epitaxial structures 121, and the second transistor device 13 includes a pair of the second epitaxial structures 131. The sidewall spacers 22 laterally cover lower portions of the first epitaxial structures 121 and the second epitaxial structures 131.

Figure 54:
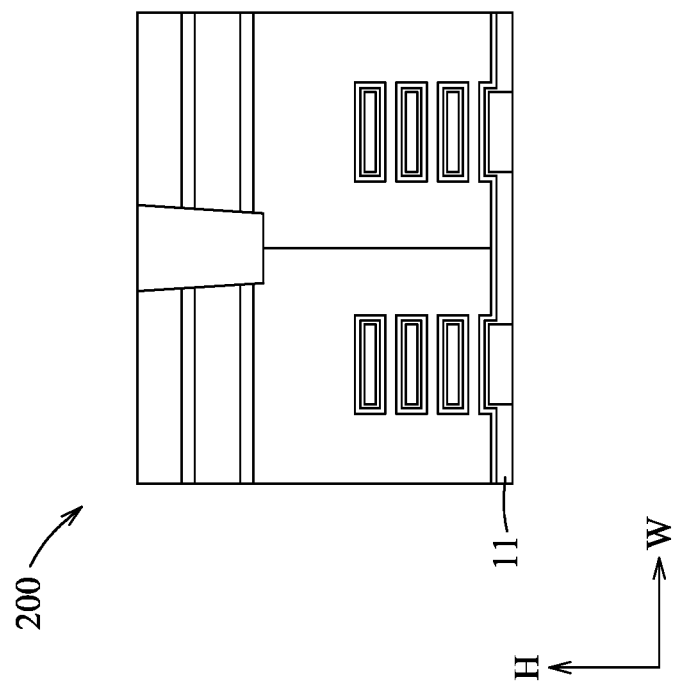
Figure 53:
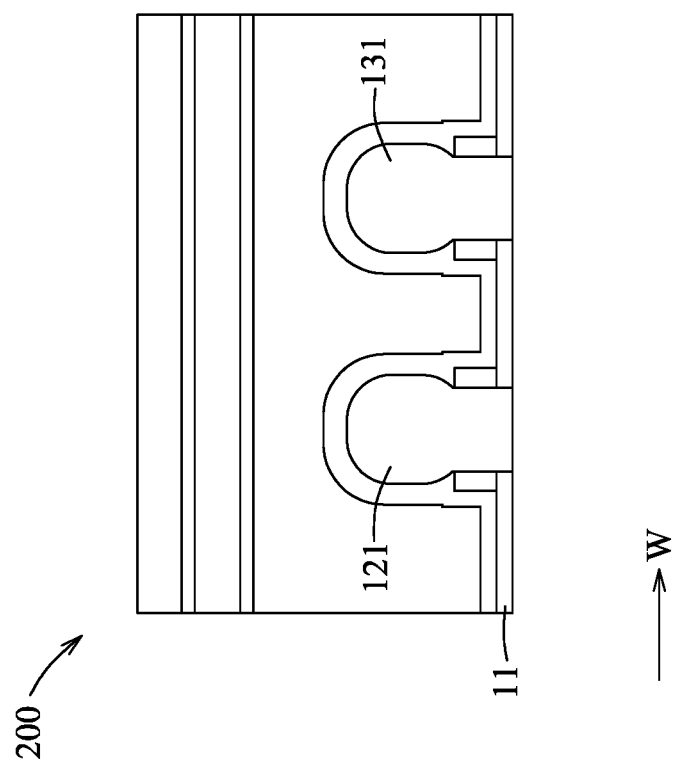

Referring to FIG. 48 and the example illustrated in FIGS. 52 to 54, the method 300 proceeds to step 302, where a planarization process is conducted. An upper surface of the semiconductor device 200 is bonded to a carrier substrate (not shown). Thereafter, the semiconductor device 200 is flipped over to turn the back side of the substrate 11 upwards. A planarization process (for example, but not limited to, a chemical mechanical planarization (CMP) process) is conducted on the back side of the substrate 11 to remove a portion of the substrate 11 so as to expose the first epitaxial structures 121 and the second epitaxial structures 131.

Figures 55, 56:
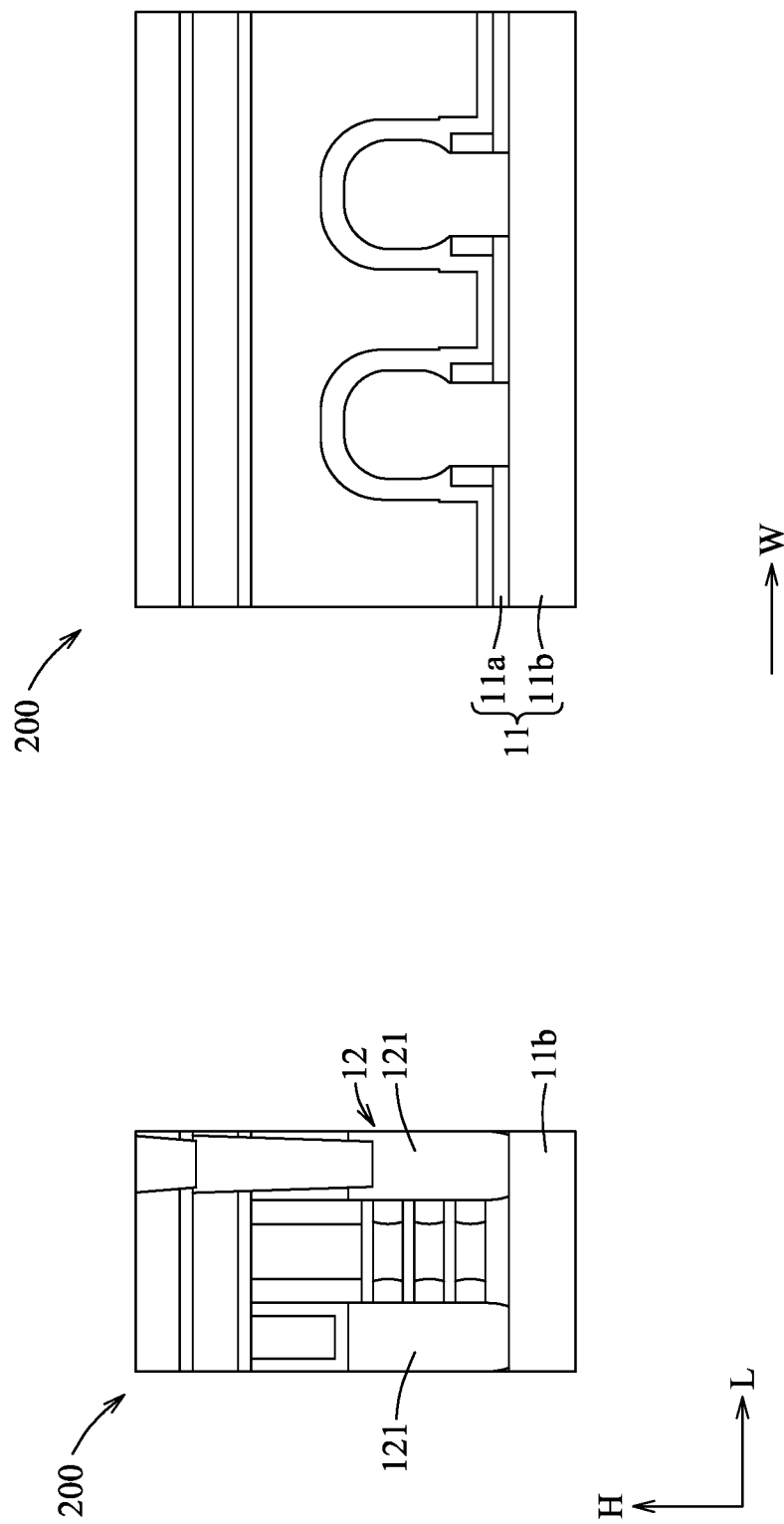
Figure 57:
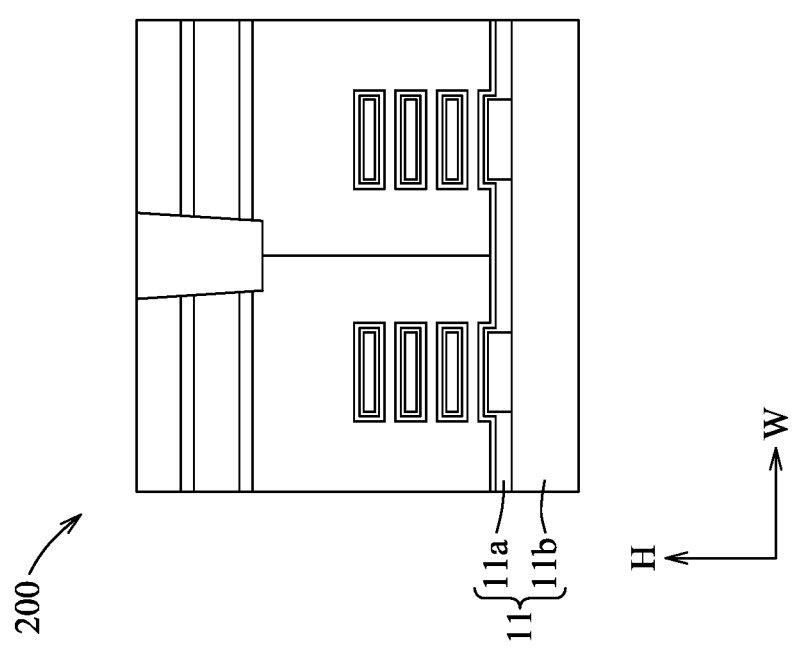

Referring to FIG. 48 and the example illustrated in FIGS. 55 to 57, the method 300 proceeds to step 303, where a dielectric layer is deposited. A dielectric layer is deposited such that the substrate 11 includes the upper semiconductor sub-layer 11a and the lower dielectric sub-layer 11b as described above with reference to FIGS. 9 to 11. The dielectric layer may include a low-k dielectric material, for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), silicon carbide (SiC), or combinations thereof. Other suitable low-k dielectric materials are within the contemplated scope of the present disclosure. In some embodiments, the dielectric layer may be formed by a suitable deposition process as is known in the art of semiconductor fabrication, for example, but not limited to, chemical vapor deposition (CVD), atomic layer deposition (ALD), spin coating, or the like. Other suitable deposition techniques are within the contemplated scope of the present disclosure.

Figure 58:
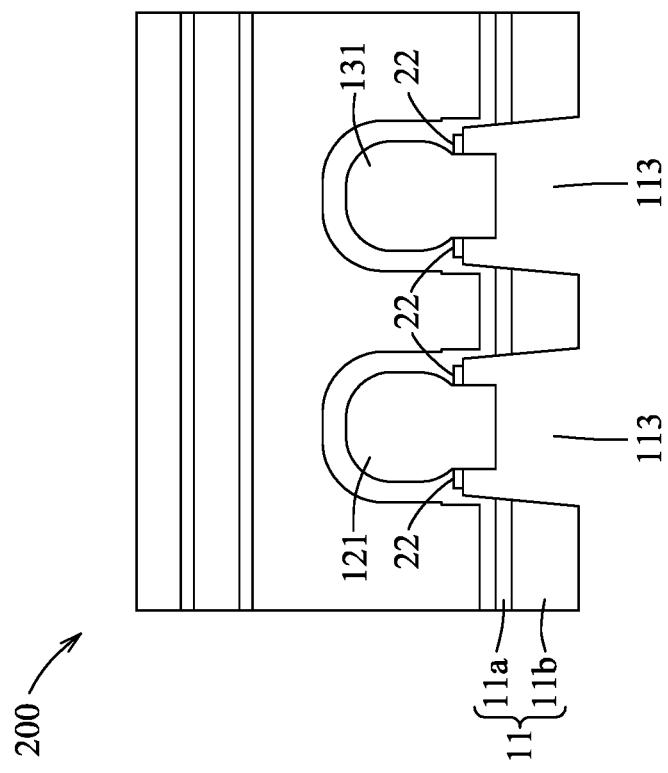

Referring to FIG. 48 and the example illustrated in FIG. 58, the method 300 proceeds to step 304, where a first etching process is conducted. A first etching process is conducted through a patterned mask (not shown) disposed on the back side of the substrate 11 to pattern the substrate 11 (i.e., the upper semiconductor sub-layer 11a and the lower dielectric sub-layer 11b) and to selectively etch away at least portions of the sidewall spacers 22 so as to expose the lower portions of the first and second epitaxial structures 121, 131 through openings 113 that are formed by the first etching process and extending inwardly from the back side of the substrate 11. In some embodiments, the first etching process may be conducted by, for example, but not limited to, a selective wet etching process using one or more etchants having an etching selectivity such that the sidewall spacers 22 may be selectively etched away at a rate greater than that for the first and second epitaxial structures 121, 131.

Figure 59:
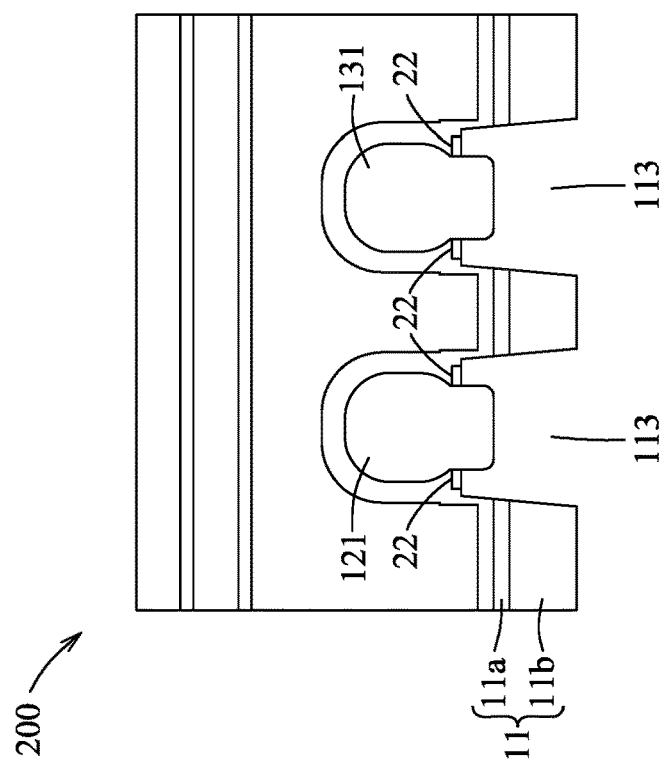

Referring to FIG. 48 and the example illustrated in FIG. 59, the method 300 proceeds to step 305, where a second etching process is conducted. A second etching process is conducted through the openings 113 to etch away portions of the lower portions of the first and second epitaxial structures 121, 131. In some embodiments, the second etching process may be conducted, for example, but not limited to, a wet etching process.

Figure 60:
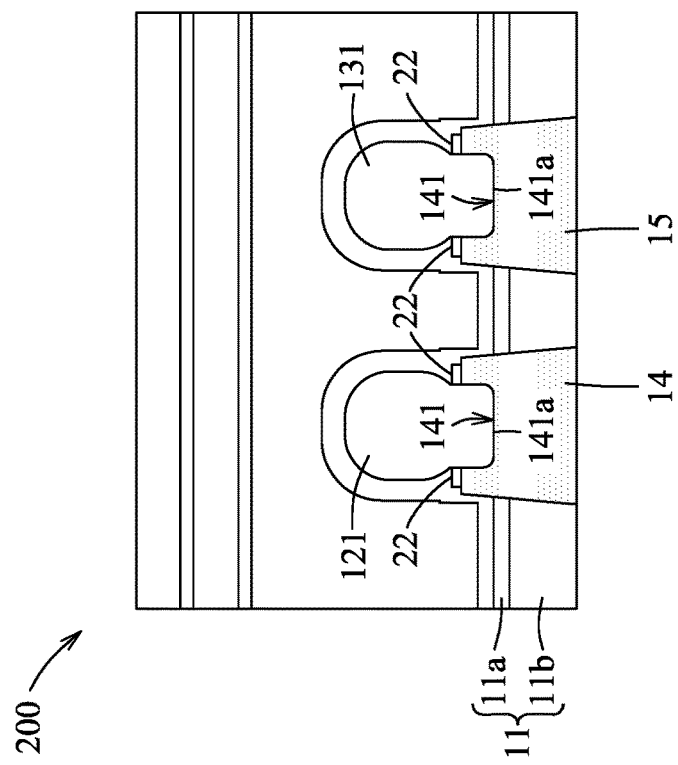

Referring to FIG. 48 and the example illustrated in FIG. 60, the method 300 proceeds to step 306, where a conductive material is then filled into the openings 113 by a suitable deposition process as is known to those skilled in the art of semiconductor fabrication (for example, but not limited to, CVD, plasma-enhanced CVD (PECVD), ALD, plasma-enhanced ALD (PEALD), physical vapor deposition (PVD), or the like), and a planarization process (for example, but not limited to, a CMP process) is then conducted to remove excess of the conductive material over the back side of the substrate 11 so as to form the first and second back-side via structures 14, 15, each of which has the recessed surface 141 formed with the bottom surface portion 141a that is configured as a flat surface. In some embodiments, the conductive material may include, for example, but not limited to, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), molybdenum (Mo), or the like, or alloys thereof, which have good conductivity. Other suitable conductive materials are within the contemplated scope of the present disclosure.

Figure 63:
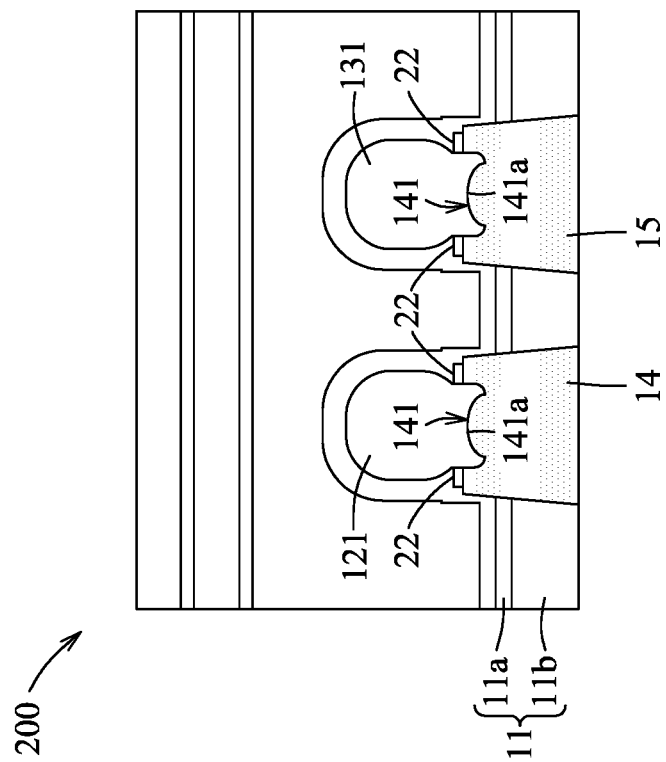

Referring to FIG. 48 and the examples illustrated in FIGS. 61 to 63, in some embodiments, the first etching process is conducted through the patterned mask to pattern the substrate 11 and to selectively etch away parts of the lower portions of the first and second epitaxial structures 121, 131 so as to expose the lower portions of the first and second epitaxial structures 121, 131 through the openings 113 and to permit each of the lower portions of the first and second epitaxial structures 121, 131 to be formed with a concave surface. In some embodiments, the first etching process may be conducted by, for example, but not limited to, a selective wet etching process using one or more etchants having an etching selectivity such that the first and second epitaxial structures 121, 131 may be selectively etched away at a rate greater than that for the sidewall spacers 22 and the upper semiconductor sub-layer 11a. The second etching process is conducted through the openings 113 to etch away portions of the upper semiconductor sub-layer 11a and at least portions of the sidewall spacers 22. Each of the first and second back-side via structures 14, 15 formed by filling the conductive material into the openings 113 has the recessed surface 141 formed with the bottom surface portion 141a that is configured as a convex surface.

In a semiconductor device of the present disclosure, a back-side via structure is formed on a back side of a substrate to wrap around a lower portion of an epitaxial structure formed on a front side of the substrate. The back-side via structure has a recessed surface configured to be connected to the lower portion of the epitaxial structure. The recessed surface has a bottom surface portion connected to a bottom surface of the lower portion of the epitaxial structure, and at least one sidewall surface portion connected to a corresponding one lateral surface of the lower portion of the epitaxial structure, such that the resistance between the back-side via structure and the lower portion of the epitaxial structure can be reduced by increasing the connecting area between the back-side via structure and the lower portion of the epitaxial structure. In addition, the back-side via structure has a width greater than that of the epitaxial structure in a channel width direction, thereby further reducing the resistance of the back-side via structure. Moreover, spreading resistance produced through the epitaxial structure can be reduced by increasing a depth of an upper portion of the back-side via structure inserted into the epitaxial structure.

In accordance with some embodiments of the present disclosure, a semiconductor device includes a substrate, a first transistor structure, and a first back-side via structure. The substrate has a first side and a second side opposite to each other. The first transistor structure is disposed on the first side of the substrate, and includes a pair of first epitaxial structures spaced apart from each other and a channel feature extending in a channel length direction to be disposed between the first epitaxial structures. The channel feature has a width W3 in a channel width direction transverse to the channel length direction. The first back-side via structure is disposed on the second side of the substrate and extends through the substrate. The first back-side via structure is connected to a corresponding one of the first epitaxial structures and has a width W1 in the channel width direction. W1 is greater than W3.

In accordance with some embodiments of the present disclosure, a difference in value value between W1 and W3 ranges from about 2 nm to about 20 nm.

In accordance with some embodiments of the present disclosure, the first back-side via structure is formed with a recessed surface which is configured to be connected to a lower portion of the corresponding one of the first epitaxial structures and which is recessed inwardly from an upper surface of the first back-side via structure. The recessed surface has a bottom surface portion connected to a bottom surface of the lower portion of the corresponding one of the first epitaxial structures, and a first sidewall surface portion extending between the upper surface of the first back-side via structure and the bottom surface portion of the recessed surface of the first back-side via structure and connected to a first lateral surface of the lower portion of the corresponding one of the first epitaxial structures.

In accordance with some embodiments of the present disclosure, the bottom surface portion of the recessed surface is configured as a flat surface and the first sidewall surface portion of the recessed surface is configured as a curved sidewall surface.

In accordance with some embodiments of the present disclosure, the recessed surface of the first back-side via structure further has a second sidewall surface portion extending between the upper surface of the first back-side via structure and the bottom surface portion of the recessed surface of the first back-side via structure and connected to a second lateral surface of the lower portion of the corresponding one of the first epitaxial structures opposite to the first lateral surface of the lower portion of the corresponding one of the first epitaxial structures in the channel width direction. The bottom surface portion of the recessed surface of the first back-side via structure is configured as one of a flat surface and a convex surface, and each of the first and second sidewall surface portions of the recessed surface of the first back-side via structure is configured as a curved sidewall surface.

In accordance with some embodiments of the present disclosure, the bottom surface portion of the recessed surface of the first back-side via structure and the upper surface of the first back-side via structure have a distance D1 therebetween. The recessed surface of the first back-side via structure has a horizontal width W2 in the channel width direction, and a ratio of W2 to D1 ranges from about 1 to about 30.

In accordance with some embodiments of the present disclosure, an upper portion of the first back-side via structure is inserted into the corresponding one of the first epitaxial structures by a depth ranging from about 2 nm to about 10 nm.

In accordance with some embodiments of the present disclosure, an upper portion of the first back-side via structure is inserted into the corresponding one of the first epitaxial structures by a depth ranging from about 10 nm to about 60 nm.

In accordance with some embodiments of the present disclosure, the bottom surface portion of the recessed surface of the first back-side via structure is configured as the convex surface, an upper portion of the first back-side via structure is inserted into the corresponding one of the first epitaxial structures by a depth H1, the bottom surface portion of the recessed surface of the first back-side via structure has a vertical height H4, and a ratio of H1 to H4 ranges from about 1.5 to about 3.0.

In accordance with some embodiments of the present disclosure, the bottom surface portion of the recessed surface of the first back-side via structure is configured as the convex surface, an upper portion of the first back-side via structure is inserted into the corresponding one of the first epitaxial structures by a depth H1, a lower end of each of the first and second sidewall surface portions of the recessed surface of the first back-side via structure and a lower end of the upper portion of the first back-side via structure inserted into the corresponding one of the first epitaxial structures have a height H5 therebetween, and a ratio of H1 to H5 ranges from about 1.5 to about 3.0.

In accordance with some embodiments of the present disclosure, the semiconductor device further includes a second transistor structure and a second back-side via structure. The second transistor structure is disposed on the first side of the substrate, and includes a pair of second epitaxial structures spaced apart from each other in the channel length direction. The second back-side via structure is disposed on the second side of the substrate and extends through the substrate. The second back-side via structure is connected to a corresponding one of the second epitaxial structures and is formed with a recessed surface which is configured to be connected to a lower portion of the corresponding one of the second epitaxial structures and which is recessed inwardly from an upper surface of the second back-side via structure. The recessed surface of the second back-side via structure has a bottom surface portion, a first sidewall surface portion, and a second sidewall portion. The bottom surface portion is configured as a flat surface to be connected to a bottom surface of the lower portion of the corresponding one of the second epitaxial structures. The first sidewall surface portion and the second sidewall portion extend between the upper surface of the second back-side via structure and the bottom surface portion of the recessed surface of the second back-side via structure and are respectively connected to a first lateral surface and a second lateral surface of the lower portion of the corresponding one of the second epitaxial structures opposite to each other in the channel width direction.

In accordance with some embodiments of the present disclosure, the first epitaxial structures have a height H6, the second epitaxial structures has a height H7, and a ratio of H6 to H7 ranges from about 0.7 to about 1.3.

In accordance with some embodiments of the present disclosure, an upper portion of the first back-side via structure is inserted into the corresponding one of the first epitaxial structures by a depth H8, an upper portion of the second back-side via structure is inserted into the corresponding one of the second epitaxial structures by a depth H9, and a ratio of H8 to H9 ranges from about 0.5 to about 2.0.

In accordance with some embodiments of the present disclosure, the bottom surface portion of the recessed surface of the first back-side via structure and the upper surface of the first back-side via structure have a distance D2 therebetween, the bottom surface portion of the recessed surface of the second back-side via structure and the upper surface of the second back-side via structure have a distance D3 therebetween, and a ratio of D2 to D3 ranges from about 0.2 to about 5.0.

In accordance with some embodiments of the present disclosure, a semiconductor device includes a substrate, a transistor structure, and a back-side via structure. The substrate has a first side and a second side opposite to each other. The transistor structure is disposed on the first side of the substrate, and includes a pair of epitaxial structures spaced apart from each other and a channel feature extending in a channel length direction to be disposed between the epitaxial structures. The back-side via structure is disposed on the second side of the substrate and extends through the substrate. The back-side via structure is connected to a corresponding one of the epitaxial structures and is formed with a recessed surface which is configured to be connected to a lower portion of the corresponding one of the epitaxial structures and which is recessed inwardly from an upper surface of the back-side via structure. The recessed surface has a bottom surface portion and a first sidewall surface portion. The bottom surface portion is connected to a bottom surface of the lower portion of the corresponding one of the epitaxial structures. The first sidewall surface portion extends between the upper surface of the back-side via structure and the bottom surface portion of the recessed surface and is connected to a first lateral surface of the lower portion of the corresponding one of the epitaxial structures.

In accordance with some embodiments of the present disclosure, the bottom surface portion is configured as a flat surface.

In accordance with some embodiments of the present disclosure, the recessed surface further has a second sidewall surface portion extending between the upper surface of the back-side via structure and the bottom surface portion of the recessed surface and connected to a second lateral surface of the lower portion of the corresponding one of the epitaxial structures opposite to the first lateral surface of the lower portion of the corresponding one of the epitaxial structures in the channel width direction. The bottom surface portion is configured as one of a flat surface and a convex surface.

In accordance with some embodiments of the present disclosure, a method for manufacturing a semiconductor device includes: forming a sidewall spacer to laterally cover a lower portion of an epitaxial structure of a transistor structure disposed on a first side of a substrate; conducting a first etching process to pattern the substrate and to selectively etch one of the sidewall spacer and the lower portion of the epitaxial structure so as to expose the lower portion of the epitaxial structure from an opening that is formed by the first etching process and that extends inwardly from a second side of the substrate opposite to the first side of the substrate; conducting a second etching process after the first etching process to selectively etch the other one of the sidewall spacer and the lower portion of the epitaxial structure; and filling a conductive material into the opening to form a back-side via structure disposed on the second side of the substrate and connected to the lower portion of the epitaxial structure.

In accordance with some embodiments of the present disclosure, the first etching process is conducted to selectively etch the sidewall spacer. The second etching process is conducted to selectively etch the lower portion of the epitaxial structure. The back-side via structure is formed with a recessed surface which is recessed inwardly from an upper surface of the back-side via structure and which has a bottom surface portion configured as a flat surface connected to a bottom surface of the lower portion of the epitaxial structure, and a sidewall surface portion extending between the upper surface of the back-side via structure and the bottom surface portion of the recessed surface and connected to a lateral surface of the lower portion of the epitaxial structure.

In accordance with some embodiments of the present disclosure, the first etching process is conducted to selectively etch the lower portion of the epitaxial structure. The second etching process is conducted to selectively etch the sidewall spacer. The back-side via structure is formed with a recessed surface which is recessed inwardly from an upper surface of the back-side via structure, and which has a bottom surface portion configured as a convex surface connected to a bottom surface of the lower portion of the epitaxial structure, and two opposite sidewall surface portions extending between the upper surface of the back-side via structure and the bottom surface portion of the recessed surface and respectively connected to two opposite lateral surfaces of the lower portion of the epitaxial structure.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate having an upper side and a lower side opposite to each other;
    a first transistor structure disposed on the upper side of the substrate, and including a pair of first epitaxial structures spaced apart from each other and a channel feature extending in a channel length direction to be disposed between the first epitaxial structures; and
    a first back-side via structure disposed on the lower side of the substrate and extending through the substrate, the first back-side via structure being directly connected to a corresponding one of the first epitaxial structures and being formed with an upper surface on opposite sides of the corresponding one of the first epitaxial structures in the channel width direction, the first back-side via structure having a width W1 in the channel width direction, the corresponding one of the first epitaxial structures having a width W2 in the channel width direction, W1 being greater than W2; and
    a sidewall spacer directly on the upper surface of the first back-side via structure and directly contacting the opposite sides of the corresponding one of the first epitaxial structures;
    wherein a lower portion of the corresponding one of the first epitaxial structures is lower than the upper surface of the first back-side via structure.

2. The semiconductor device according to claim 1, wherein the channel feature has a width W3 in the channel width direction, W1 is greater than W3, and a difference in value between W1 and W3 ranges from 2 nm to 20 nm.

3. The semiconductor device according to claim 1, wherein the first back-side via structure is formed with a recessed surface which is configured to be connected to the lower portion of the corresponding one of the first epitaxial structures and which is recessed inwardly from the upper surface of the first back-side via structure, the recessed surface having a bottom surface portion connected to a bottom surface of the lower portion of the corresponding one of the first epitaxial structures, and a first sidewall surface portion extending between the upper surface of the first back-side via structure and the bottom surface portion of the recessed surface of the first back-side via structure and connected to a first side of the opposite sides of the lower portion of the corresponding one of the first epitaxial structures.

4. The semiconductor device according to claim 3, wherein the bottom surface portion of the recessed surface is configured as a flat surface and the first sidewall surface portion of the recessed surface is configured as a curved sidewall surface.

5. The semiconductor device according to claim 3, wherein the recessed surface of the first back-side via structure further has a second sidewall surface portion extending between the upper surface of the first back-side via structure and the bottom surface portion of the recessed surface of the first back-side via structure and connected to a second side of the opposite sides of the lower portion of the corresponding one of the first epitaxial structures, the bottom surface portion of the recessed surface of the first back-side via structure being configured as one of a flat surface and a convex surface, and each of the first and second sidewall surface portions of the recessed surface of the first back-side via structure being configured as a curved sidewall surface.

6. The semiconductor device according to claim 3, wherein the bottom surface portion of the recessed surface of the first back-side via structure and the upper surface of the first back-side via structure have a distance D1 therebetween, and a ratio of W2 to D1 ranges from 1 to 30.

7. The semiconductor device according to claim 1, wherein an upper portion of the first back-side via structure is inserted into the corresponding one of the first epitaxial structures by a depth ranging from 2 nm to 10 nm.

8. The semiconductor device according to claim 1, wherein the channel feature has a width W3 in a channel width direction and a difference in value between the width W1 and the width W3 ranges from 2 nm to 20 nm.

9. The semiconductor device according to claim 5, wherein the bottom surface portion of the recessed surface of the first back-side via structure is configured as the convex surface, an upper portion of the first back-side via structure is inserted into the corresponding one of the first epitaxial structures by a depth H1, the bottom surface portion of the recessed surface of the first back-side via structure has a vertical height H4, and a ratio of H1 to H4 ranges from 1.5 to 3.0.

10. The semiconductor device according to claim 5, wherein the bottom surface portion of the recessed surface of the first back-side via structure is configured as the convex surface, an upper portion of the first back-side via structure is inserted into the corresponding one of the first epitaxial structures by a depth H1, a lower end of each of the first and second sidewall surface portions of the recessed surface of the first back-side via structure and a lower end of the upper portion of the first back-side via structure inserted into the corresponding one of the first epitaxial structures have a height H5 therebetween, and a ratio of H1 to H5 ranges from 1.5 to 3.0.

11. The semiconductor device according to claim 5, further comprising:
a second transistor structure disposed on the first side of the substrate, and including a pair of second epitaxial structures spaced apart from each other in the channel length direction; and
a second back-side via structure disposed on the second side of the substrate and extending through the substrate, the second back-side via structure being connected to a corresponding one of the second epitaxial structures and being formed with a recessed surface which is configured to be connected to a lower portion of the corresponding one of the second epitaxial structures and which is recessed inwardly from an upper surface of the second back-side via structure, the recessed surface of the second back-side via structure having:
a bottom surface portion configured as a flat surface to be connected to a bottom surface of the lower portion of the corresponding one of the second epitaxial structures, and
a first sidewall surface portion and a second sidewall portion which extend between the upper surface of the second back-side via structure and the bottom surface portion of the recessed surface of the second back-side via structure and which are respectively connected to a first lateral surface and a second lateral surface of the lower portion of the corresponding one of the second epitaxial structures opposite to each other in the channel width direction.

12. The semiconductor device according to claim 11, wherein the first epitaxial structures have a height H6, the second epitaxial structures have a height H7, and a ratio of H6 to H7 ranges from 0.7 to 1.3.

13. The semiconductor device according to claim 11, wherein an upper portion of the first back-side via structure is inserted into the corresponding one of the first epitaxial structures by a depth H8, an upper portion of the second back-side via structure is inserted into the corresponding one of the second epitaxial structures by a depth H9, and a ratio of H8 to H9 ranges from 0.5 to 2.0.

14. The semiconductor device according to claim 11, wherein the bottom surface portion of the recessed surface of the first back-side via structure and the upper surface of the first back-side via structure have a distance D2 therebetween, the bottom surface portion of the recessed surface of the second back-side via structure and the upper surface of the second back-side via structure have a distance D3 therebetween, and a ratio of D2 to D3 ranges from 0.2 to 5.0.

15. A semiconductor device comprising:
a substrate having an upper side and a lower side opposite to each other;
a transistor structure disposed on the upper side of the substrate, and including a pair of epitaxial structures spaced apart from each other and a channel feature extending in a channel length direction to be disposed between the epitaxial structures;
a back-side via structure disposed on the lower side of the substrate and extending through the substrate, the back-side via structure being connected to a corresponding one of the epitaxial structures, the back-side via structure being formed with an upper surface on opposite sides of the corresponding one of the epitaxial structures in a channel width direction transverse to the channel length direction and a recessed surface which is recessed inwardly from the upper surface, the back-side via structure being connected to a lower portion of the corresponding one of the epitaxial structures; and
a sidewall spacer directly on the upper surface of the back-side via structure and directly contacting the opposite sides of the corresponding one of the epitaxial structures,
wherein the recessed surface has a bottom surface portion directly connected to a bottom surface of the lower portion of the corresponding one of the epitaxial structures, and a first sidewall surface portion extending between the upper surface of the back-side via structure and the bottom surface portion of the recessed surface and connected to a first side of the opposite sides of the lower portion of the corresponding one of the epitaxial structures.

16. The semiconductor device according to claim 15, wherein the bottom surface portion is configured as a flat surface.

17. The semiconductor device according to claim 16, wherein the recessed surface further has a second sidewall surface portion extending between the upper surface of the back-side via structure and the bottom surface portion of the recessed surface and connected to a second side of the opposite sides of the lower portion of the corresponding one of the epitaxial structures, the bottom surface portion being configured as one of a flat surface and a convex surface.

18. A method for manufacturing a semiconductor device, comprising:

forming a sidewall spacer to laterally cover a lower portion of an epitaxial structure of a transistor structure disposed on an upper side of a substrate;

conducting a first etching process to pattern the substrate and form an opening that extends inwardly from a lower side of the substrate opposite to the upper side of the substrate and exposes the lower portion of the epitaxial structure, the first etching process further selectively etching one of a first portion of the sidewall spacer and the lower portion of the epitaxial structure;

conducting a second etching process after the first etching process to selectively etch the other one of the first portion of the sidewall spacer and the lower portion of the epitaxial structure; and filling a conductive material into the opening to form a back-side via structure disposed on the lower side of the substrate and directly connected to the lower portion of the epitaxial structure;

wherein the back-side via structure is formed with an upper surface on opposite sides of the lower portion of the epitaxial structure in a channel width direction of the transistor structure which is transverse to a channel length direction of the transistor structure, and a recessed surface which is recessed inwardly from the upper surface, and a second portion of the sidewall spacer is directly on the upper surface of the back-side via structure and directly contacting the opposite sides of the corresponding one of the epitaxial structures.

19. The method according to claim 18, wherein the first etching process is conducted to selectively etch the sidewall spacer; the second etching process is conducted to selectively etch the lower portion of the epitaxial structure; and the recessed surface of the back-side via structure has a bottom surface portion configured as a flat surface connected to a bottom surface of the lower portion of the epitaxial structure, and a sidewall surface portion extending between the upper surface of the back-side via structure and the bottom surface portion of the recessed surface and connected to a lateral surface of the lower portion of the epitaxial structure.

20. The method according to claim 18, wherein the first etching process is conducted to selectively etch the lower portion of the epitaxial structure; the second etching process is conducted to selectively etch the sidewall spacer; and the recessed surface of the back-side via structure has a bottom surface portion configured as a convex surface connected to a bottom surface of the lower portion of the epitaxial structure, and two opposite sidewall surface portions extending between the upper surface of the back-side via structure and the bottom surface portion of the recessed surface and respectively connected to two opposite lateral surfaces of the lower portion of the epitaxial structure.

\* \* \* \* \*